United States Patent
Lee et al.

(10) Patent No.: US 10,756,195 B2
(45) Date of Patent: Aug. 25, 2020

(54) INTEGRATED CIRCUIT DEVICE AND METHOD OF MANUFACTURING THE SAME

(71) Applicant: Samsung Electronics Co., Ltd., Suwon-si, Gyeonggi-do (KR)

(72) Inventors: Byoung-Hoon Lee, Suwon-si (KR); Hoon-Joo Na, Hwaseong-si (KR); Sung-In Suh, Seoul (KR); Min-Woo Song, Seongnam-si (KR); Chan-Hyeong Lee, Seoul (KR); Hu-Yong Lee, Seoul (KR); Sang-Jin Hyun, Suwon-si (KR)

(73) Assignee: SAMSUNG ELECTRONICS CO., LTD., Samsung-ro, Yeongtong-gu, Suwon-si (KR)

( * ) Notice: Subject to any disclaimer, the term of this patent is extended or adjusted under 35 U.S.C. 154(b) by 0 days.

(21) Appl. No.: 16/179,250

(22) Filed: Nov. 2, 2018

(65) Prior Publication Data

US 2019/0140066 A1    May 9, 2019

(30) Foreign Application Priority Data

Nov. 3, 2017    (KR) .................. 10-2017-0146176

(51) Int. Cl.
| | |
|---|---|
| *H01L 29/49* | (2006.01) |
| *H01L 29/51* | (2006.01) |
| *H01L 29/06* | (2006.01) |
| *H01L 29/08* | (2006.01) |
| *H01L 21/02* | (2006.01) |

(Continued)

(52) U.S. Cl.
CPC ...... *H01L 29/4966* (2013.01); *H01L 21/0228* (2013.01); *H01L 21/02172* (2013.01); *H01L 21/02205* (2013.01); *H01L 21/3003* (2013.01); *H01L 21/3205* (2013.01); *H01L 29/0649* (2013.01); *H01L 29/0673* (2013.01); *H01L 29/0847* (2013.01); *H01L 29/51* (2013.01); *H01L 29/785* (2013.01); *H01L 29/66545* (2013.01)

(58) Field of Classification Search
CPC . H01L 51/56; H01L 51/5072; H01L 51/5012; H01L 27/3244; H01L 35/32
USPC .................................................. 257/288
See application file for complete search history.

(56) References Cited

U.S. PATENT DOCUMENTS

| 8,551,876 B2 | 10/2013 | Wang et al. |
| 9,337,057 B2 | 5/2016 | Park et al. |

(Continued)

FOREIGN PATENT DOCUMENTS

| JP | 2010-123660 A | 6/2010 |
| KR | 10-2018-0102273 | 9/2018 |

*Primary Examiner* — Andy Huynh
(74) *Attorney, Agent, or Firm* — Muir Patent Law, PLLC

(57) ABSTRACT

Provided are an integrated circuit device and a method of manufacturing the same. The integrated circuit device includes: a semiconductor substrate; a device isolation layer defining an active region of the semiconductor substrate; a gate insulating layer on the active region; a gate stack on the gate insulating layer; a spacer on a sidewall of the gate stack; and an impurity region provided on both sides of the gate stack, wherein the gate stack includes a metal carbide layer and a metal layer on the metal carbide layer, wherein the metal carbide layer includes a layer having a carbon content of about 0.01 at % to about 15 at %.

12 Claims, 24 Drawing Sheets

(51) Int. Cl.
*H01L 21/30* (2006.01)
*H01L 29/78* (2006.01)
*H01L 21/3205* (2006.01)
*H01L 29/66* (2006.01)

(56) References Cited

U.S. PATENT DOCUMENTS

| | | |
|---|---|---|
| 9,443,771 B1 | 9/2016 | Shen et al. |
| 9,576,958 B1 | 2/2017 | Bao et al. |
| 2015/0028430 A1* | 1/2015 | Lee .................. H01L 29/785 257/412 |
| 2016/0042953 A1 | 2/2016 | Niimi et al. |
| 2016/0351675 A1* | 12/2016 | Patil .................. H01L 27/0922 |
| 2017/0062211 A1 | 3/2017 | Lim et al. |
| 2017/0084711 A1 | 3/2017 | Lim et al. |
| 2017/0154954 A1* | 6/2017 | Lin .................. H01L 21/28264 |
| 2018/0261677 A1 | 9/2018 | Lee et al. |

\* cited by examiner

YC-YC'

XB-XB'

XB-XB'

INTEGRATED CIRCUIT DEVICE AND METHOD OF MANUFACTURING THE SAME

CROSS-REFERENCE TO RELATED APPLICATION

This application claims the benefit of Korean Patent Application No. 10-2017-0146176, filed on Nov. 3, 2017, in the Korean Intellectual Property Office, the disclosure of which is hereby incorporated herein by reference in its entirety.

FIELD

The inventive concept relates to an integrated circuit device and a method of manufacturing the same, and more particularly, to an integrated circuit device that is easily manufactured to have a compact size and a desired effective work function, thus having excellent device reliability, and a method of manufacturing the integrated circuit device.

BACKGROUND

As integrated circuit and semiconductor devices have become smaller and more highly integrated, problems associated with electrical resistance and increases in effective work function arise. As a result, it is increasingly difficult to manufacture a device having a required threshold voltage.

SUMMARY

The inventive concept provides an integrated circuit device that is easy to manufacture to have a compact size and a desired effective work function so that the integrated circuit device has excellent device reliability.

The inventive concept also provides a method of manufacturing an integrated circuit device that is easy to manufacture to have a compact size and a desired effective work function so that the integrated circuit device has excellent device reliability.

According to an aspect of the inventive concept provided is an integrated circuit device including: a semiconductor substrate; a device isolation layer defining an active region of the semiconductor substrate; a gate insulating layer on the active region; a gate stack on the gate insulating layer, wherein the gate stack includes a metal carbide layer and a metal layer on the metal carbide layer, and wherein the metal carbide layer includes at least one layer having a carbon content of about 0.01 at % to about 15 at %; a spacer on a sidewall of the gate stack; and an impurity region provided on both sides of the gate stack.

According to another aspect of the inventive concept, provided is an integrated circuit device including: a semiconductor substrate; a device isolation layer defining an active region of the semiconductor substrate; at least one nanosheet at a position apart from a top surface of the active region to face a top surface of the active region, the at least one nanosheet having a channel region; a gate disposed under and on the at least one nanosheet, wherein the gate includes at least one of a metal carbide layer and a metal nitride layer; a gate insulating layer interposed between the at least one nanosheet and the gate; and an impurity region disposed on the active region on both sides of the at least one nanosheet.

According to another aspect of the inventive concept, provided is an integrated circuit device including: a semiconductor substrate; a device isolation layer defining an active region of the semiconductor substrate; a gate insulating layer on the active region; a gate stack on the gate insulating layer, wherein the gate stack includes a metal carbide layer and a metal layer on the metal carbide layer, wherein the metal carbide layer includes a first metal carbide layer and a second metal carbide layer having different carbon contents, and the first metal carbide layer and the second metal carbide layer include the same type of metal; a spacer on a sidewall of the gate stack; and an impurity region provided on both sides of the gate stack.

According to another aspect of the inventive concept, there is provided a method of manufacturing an integrated circuit device, the method including: forming a gate insulating layer on an active region of a semiconductor substrate; forming a metal carbide layer on the gate insulating layer, wherein the forming of the metal carbide layer includes: supplying a first organometallic compound which is a first metal precursor for forming the metal carbide layer; purging an excess of the first organometallic compound; forming a first layer comprising metal from the first metal precursor; and performing hydrogen plasma treatment to remove carbon from the metal carbide layer; forming a metal layer on the metal carbide layer; and forming an impurity region on both sides of the metal layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

As used herein, the term "and/or" includes any and all combinations of one or more of the associated listed items. Expressions such as "at least one of," when preceding a list of elements, modify the entire list of elements and do not modify the individual elements of the list.

Although the drawings relating to an integrated circuit device according to some embodiments of the inventive concept illustrate a fin-type transistor (fin field effect transistor, FinFET) including a channel region of a fin-shaped pattern, the inventive concept is not limited thereto. An integrated circuit device according to some embodiments of the inventive concept may include a tunneling FET, a transistor including a nanowire, a transistor including a nanosheet, or a three-dimensional (3D) transistor. In addition, an integrated circuit device according to some embodiments of the inventive concept may include a bipolar junction transistor, a lateral double diffusion transistor (LDMOS), and the like.

According to an embodiment of the inventive concept, there is provided an integrated circuit device including: a semiconductor substrate; a device isolation layer defining an active region of the semiconductor substrate; a gate insulating layer on the active region; a gate stack on the gate insulating layer; a spacer on a sidewall of the gate stack; and an impurity region provided on both sides of the gate stack.

Figure 1A:
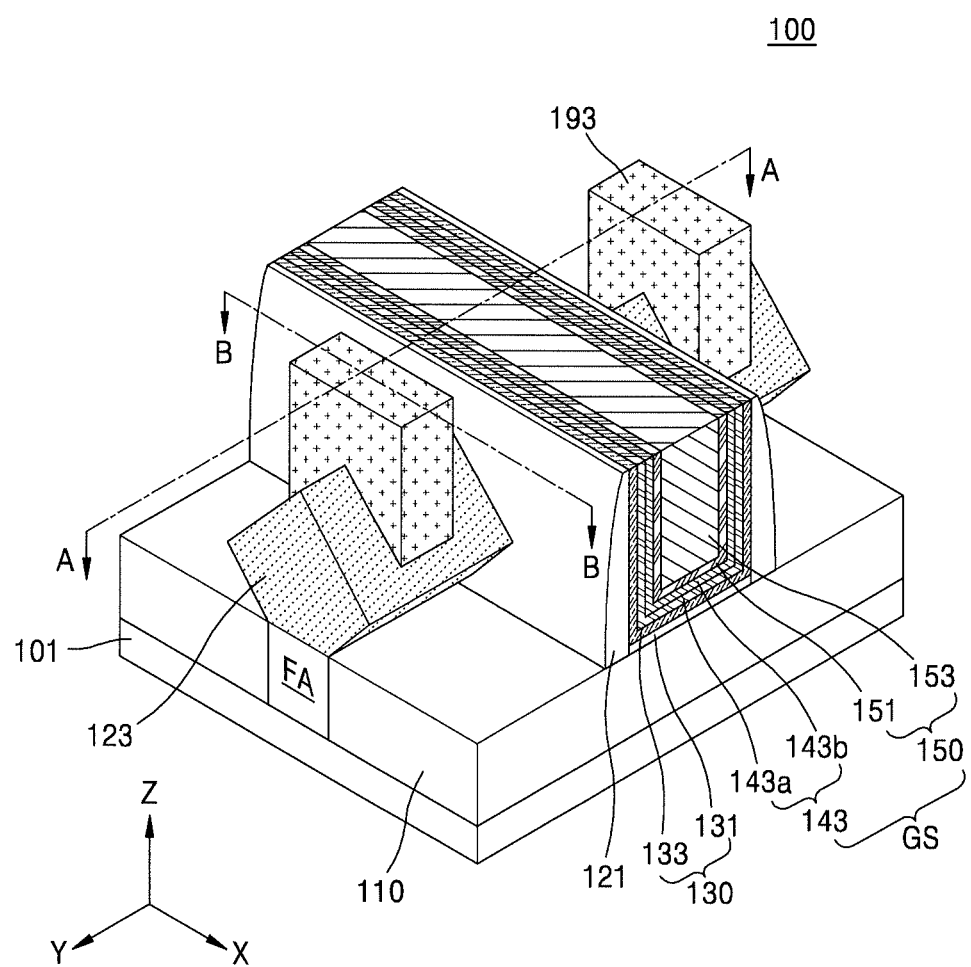
FIG. 1A is a perspective view of an integrated circuit device according to an embodiment of the inventive concept.
Figure 1B:
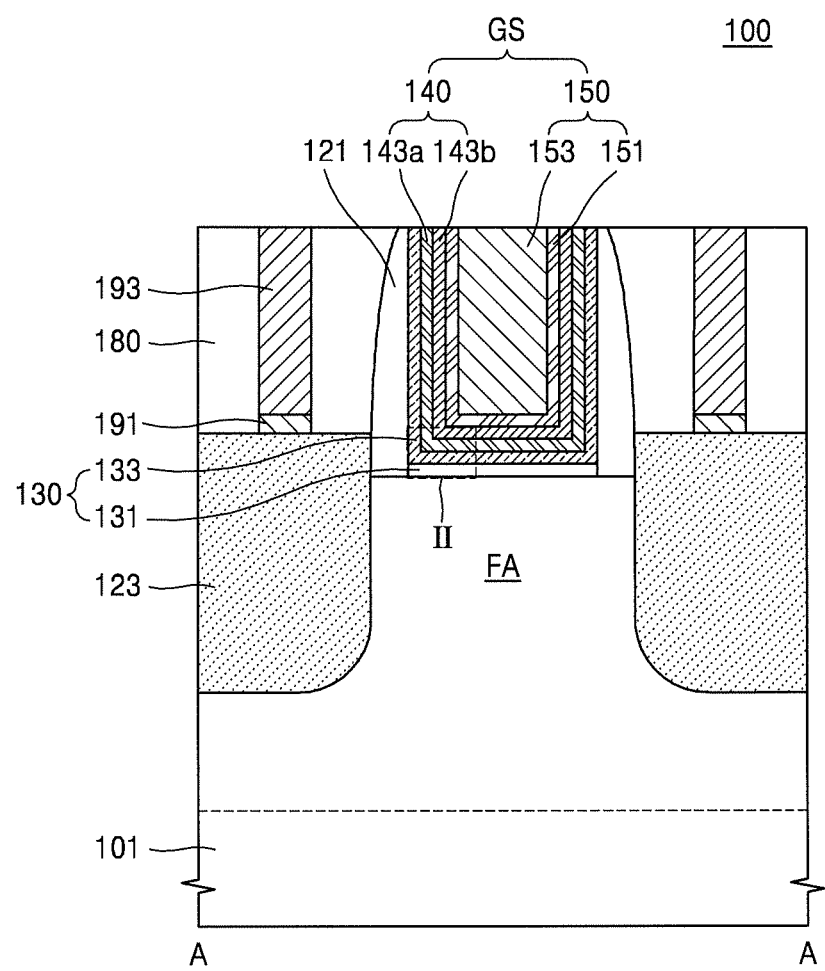
FIG. 1B is a side cross-sectional view illustrating a cross-section of the integrated circuit device of FIG. 1A taken along a line A-A.

FIG. 1A is a perspective view of an integrated circuit device 100 according to an embodiment of the inventive concept. FIG. 1B is a side cross-sectional view illustrating a cross-section of the integrated circuit device 100 of FIG. 1A taken along a line A-A.

Referring to FIGS. 1A and 1B, a semiconductor substrate 101 is provided, and an active region FA of the semiconductor substrate 101 may be defined by a device isolation layer 110.

The semiconductor substrate 101 may include at least one of a group III-V material and a group IV material. The group III-V material may be a binary, ternary, or quaternary compound including at least one group III element and at least one group V element. The group III-V material may be a compound including at least one element of In, Ga and Al as a group III element and at least one element of As, P and Sb as a group V element. For example, the group III-V material may be selected from InP, $In_zGa_{1-z}As$ (0≤z≤1), and $Al_zGa_{1-z}As$ (0≤z≤1). The binary compound may be one of, for example, InP, GaAs, InAs, InSb, and GaSb. The ternary compound may be one of InGaP, InGaAs, AlInAs, InGaSb, GaAsSb, and GaAsP. The group IV material may be Si and/or Ge. However, the group III-V material and the group IV material that may be used to form a thin film according to the inventive concept are not limited to the above-described examples.

The group III-V material, and the group IV material such as Ge, may be used as a channel material to form a low-power and high-speed transistor. A high-performance complementary metal oxide semiconductor (CMOS) may be formed by using a semiconductor substrate formed of a group III-V material having a higher electron mobility than a Si substrate, for example, GaAs, and a semiconductor material having a higher hole mobility than a Si substrate, for example, a SiGe semiconductor substrate including Ge. In some embodiments, when an n-type channel is intended to be formed in the semiconductor substrate 101, the semiconductor substrate 101 may be formed of any one of the group III-V materials described above or SiC. In some other embodiments, when a p-type channel is intended to be formed in the semiconductor substrate 101, the semiconductor substrate 101 may be formed of SiGe.

In some embodiments, the semiconductor substrate 101 may be a silicon-on-insulator (SOI) substrate.

The device isolation layer 110 may have a shallow trench isolation (STI) structure and include, for example, silicon oxide.

A gate insulating layer 130 may be provided on the active region FA. The gate insulating layer 130 may include an interface layer 131 and a high-k insulating layer 133.

The interface layer 131 may include a low-k insulating layer having a permittivity of about 9 or less. In some embodiments, the interface layer 131 may be formed of silicon oxide, silicon oxynitride, or a combination thereof. In some other embodiments, the interface layer 131 may be formed of silicate, a combination of silicate and silicon oxide, or a combination of silicate and silicon oxynitride. In some embodiments, the interface layer 131 may have a thickness of about 0.5 nm to about 2 nm. However, the inventive concept is not limited thereto.

The high-k insulating layer 133 may include a metal oxide having a higher dielectric constant than silicon oxide. For example, the high-k insulating layer 133 may have a dielectric constant of about 10 to about 25. The high-k insulating layer 133 may be formed of a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but is not limited thereto.

A gate stack GS may be provided on the gate insulating layer 130. The gate stack GS may include a work function adjusting layer 140 and a gate electrode 150.

The gate electrode 150 may include a conductive barrier layer 151 and a metal layer 153.

The metal layer 153 may include at least one metal selected from the group consisting of titanium (Ti), tungsten (W), aluminum (Al), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd).

The conductive barrier layer 151 may be formed of a binary metal nitride such as titanium nitride (TiN), tantalum nitride (TaN), tungsten nitride (WN), or hafnium nitride (HfN) and a ternary metal nitride such as titanium aluminum nitride (TiAlN), tantalum aluminum nitride (TaAlN), or hafnium aluminum nitride (HfAlN). The conductive barrier layer 151 may be formed of a single layer or a composite layer in which two or more layers are stacked.

The work function adjusting layer 140 may include a first metal carbide layer 143a and a second metal carbide layer 143b. The first metal carbide layer 143a may include carbon at a first concentration. The second metal carbide layer 143b may include carbon at a second concentration. In some embodiments, the first concentration may be higher than the second concentration. In some other embodiments, the first concentration may be lower than the second concentration.

In some embodiments, the first concentration may be from about 0.01 at % to about 15 at %, and the second concentration may be from about 15 at % to about 30 at %. In some other embodiments, the second concentration may be from about 0.01 at % to about 15 at %, and the first concentration may be from about 15 at % to about 30 at %.

The first metal carbide layer 143a and the second metal carbide layer 143b may be formed of at least one metal selected from the group consisting of titanium (Ti), tantalum (Ta), ruthenium (Ru), niobium (Nb), molybdenum (Mo), aluminum (Al), hafnium (Hf), lanthanum (La), vanadium (V), and tungsten (W). For example, the first metal carbide layer 143a and the second metal carbide layer 143b may be each TiAlC, TaAlC, WC, VC, HfAlC, RuAlC, NbAlC, MoAlC, LaAlC, WAlC, VAlC, or the like. However, the inventive concept is not limited thereto.

In some embodiments, the first metal carbide layer 143a and the second metal carbide layer 143b may include the same type of metal, and differ only in carbon content. For example, the first metal carbide layer 143a and the second metal carbide layer 143b may be any one of TiAlC, TaAlC, WC, VC, HfAlC, RuAlC, NbAlC, MoAlC, LaAlC, WAlC, and VAlC, and may differ only in carbon content.

Although the second metal carbide layer 143b is illustrated as being located on the first metal carbide layer 143a in FIGS. 1A and 1B, the first metal carbide layer 143a may also be located on the second metal carbide layer 143b.

Carbon included in the first and second metal carbide layers 143a and 143b originates from a hydrocarbon component included in a precursor of a metal element, and is a hindrance in achieving a low electrical resistance, and thus, a low electrical resistance may be obtained by using the first and second metal carbide layers 143a and 143b having a low carbon content. A low electrical resistance also allows a smaller thickness of the first and second metal carbide layers 143a and 143b, thereby resulting in a lower effective work function. Thus, a smaller integrated circuit device may be manufactured while maintaining reliability.

Although a work function adjusting layer 140 that includes no carbon may be manufactured by using physical vapor deposition (PVD) by using a metal target, when a size of an integrated circuit device is extremely small, it is difficult to form a conformal layer, and thus this manufacturing method using PVD may be difficult to apply to the manufacture of integrated circuit devices.

An insulating spacer 121 may be provided along sidewalls of the gate stack GS and the gate insulating layer 130. The insulating spacer 121 may be formed of a low-permittivity insulating material having a dielectric constant of about 7 or less. The term "low permittivity" as used herein may indicate a permittivity of less than 7. In some embodiments, the insulating spacer 121 may be SiOCN, SiCN, SiBN, SiBCN, or a combination thereof.

An impurity region 123 may be formed on both sides of the gate stack GS and the gate insulating layer 130, in the fin-type active region FA. The impurity region 123 may include a semiconductor layer that is epitaxially grown from the fin-type active region FA. The impurity region 123 may be formed of a semiconductor layer doped with an impurity and function as a source/drain region. In some embodiments, the impurity region 123 may be formed of impurity-doped Si, impurity-doped SiGe, or impurity-doped SiC.

A fin recess having a top surface at a lower level than a top surface of other regions of the fin-type active region FA may be formed in a portion of the fin-type active region FA. The impurity region 123 may include a semiconductor layer epitaxially grown on the fin recess. In some embodiments, the impurity region 123 may have an embedded SiGe structure including a plurality of epitaxially grown SiGe layers. The plurality of SiGe layers may have different Ge contents. In some other embodiments, the impurity region 123 may be formed of an epitaxially grown Si layer or an epitaxially grown SiC layer.

The impurity region 123 may have a raised source/drain (RSD) structure having a top surface at a higher level than a top surface of the fin-type active region FA.

The impurity region 123 may be electrically connected to another integrated circuit or semiconductor device through a contact 193 penetrating an interlayer insulating layer 180. In addition, a silicide layer 191 may be provided between the impurity region 123 and the contact 193 to reduce surface resistance, contact resistance or the like between the impurity region 123 and the contact 193. The silicide layer 191 may include platinum (Pt), nickel (Ni), cobalt (Co), or the like.

Figure 2:
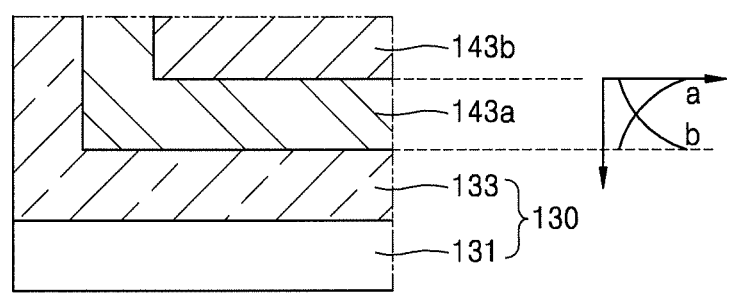
FIG. 2 is a partially enlarged view of a lower left portion of a gate stack of FIG. 1B.

In some embodiments, a carbon content of the first metal carbide layer 143a may be from about 0.01 at % to about 15 at %, and a carbon concentration of a portion of the first metal carbide layer 143a may be gradually varied toward the gate insulating layer 130. FIG. 2 is a partially enlarged view of a lower left portion of the gate stack GS of FIG. 1B.

Referring to FIG. 2, a carbon concentration in the first metal carbide layer 143a may gradually decrease (Curve a) or increase (Curve b) with respect to a distance from the gate insulating layer 130. In some embodiments, a carbon concentration of only a portion of the first metal carbide layer 143a may be gradually varied (increased or decreased) with respect a thickness direction of the first metal carbide layer 143a.

Figure 3A:
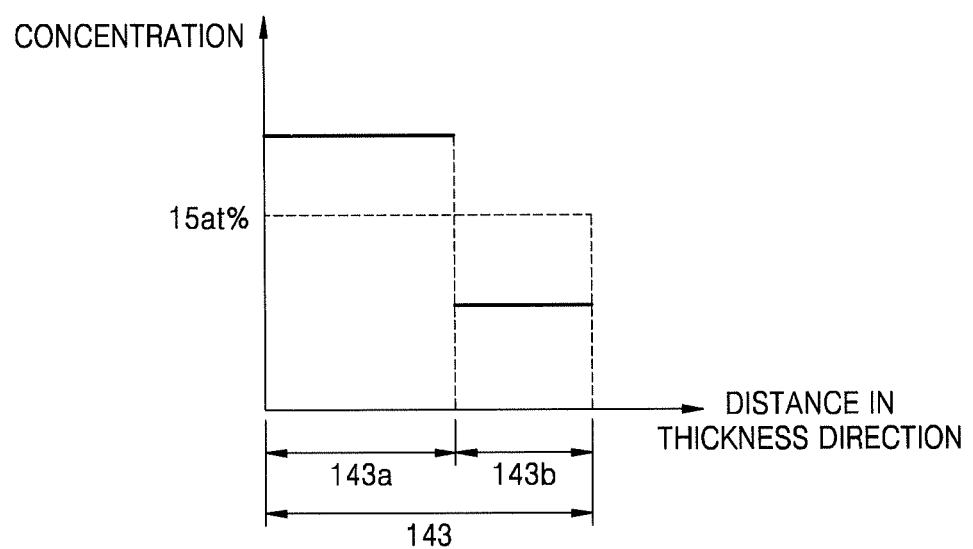
FIGS. 3A through 3C are graphs showing a carbon concentration of metal carbide layers with respect to a thickness thereof according to non-limiting embodiments of the inventive concept.
Figure 3B:
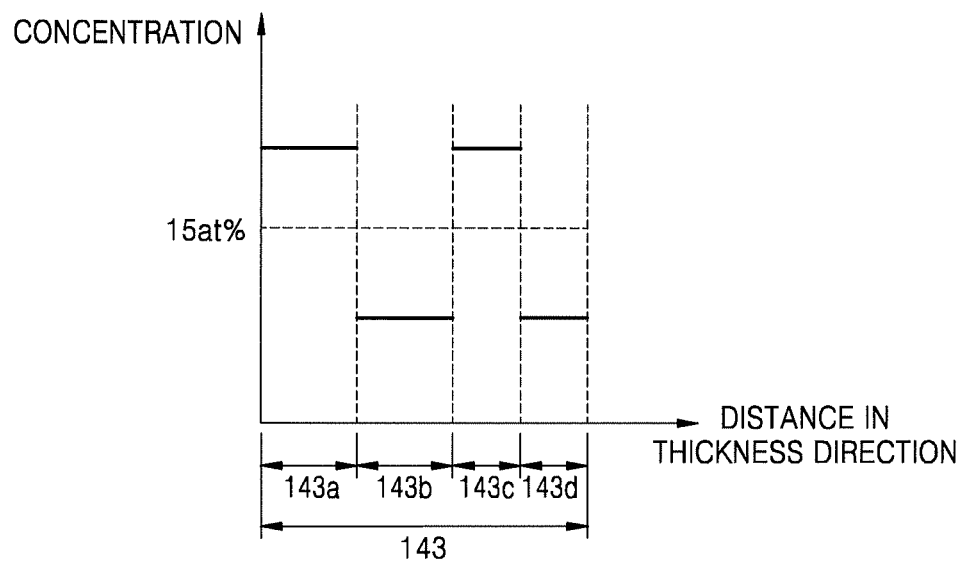
Figure 3C:
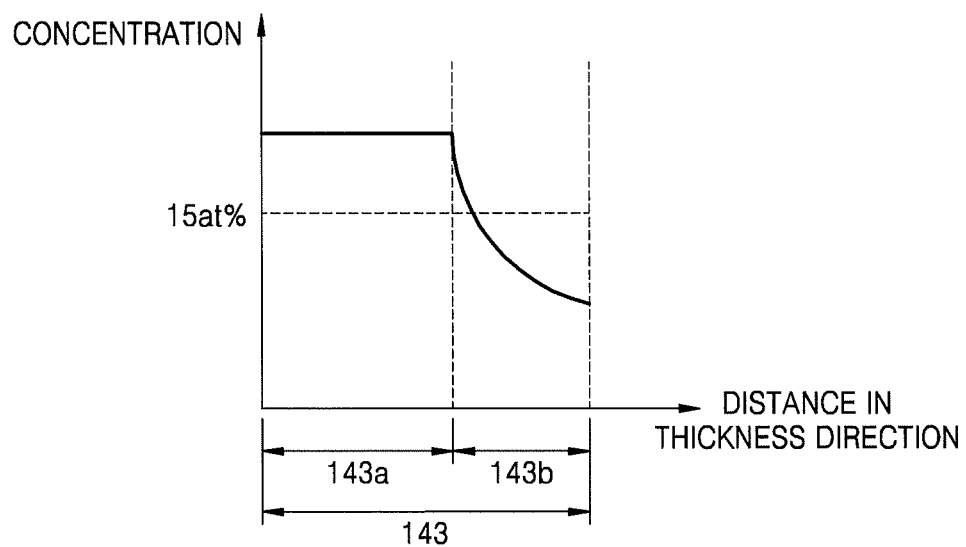

Similarly, a metal carbide layer may have various compositions as long as the metal carbide layer includes a layer of a relatively low carbon concentration (from about 0.01 at % to about 15 at %). FIGS. 3A through 3C are graphs showing a carbon concentration of metal carbide layers according to non-limiting embodiments of the inventive concept, with respect to a thickness of the layers. In FIGS. 3A through 3C, a horizontal axis denotes a distance from a surface of a metal carbide layer in a thickness direction, and a vertical axis denotes a carbon concentration at a corresponding position.

Referring to FIG. 3A, the metal carbide layer 143 includes the first metal carbide layer 143a having a uniform and relatively high carbon concentration and the second metal carbide layer 143b having a uniform and relatively low carbon concentration.

An integrated circuit device having a desired effective work function and threshold voltage may be manufactured by adjusting a thickness (represented by a length in a horizontal direction of FIG. 3A-3C) of each of the first and second metal carbide layers 143a and 143b and a carbon concentration (represented by a length in a vertical direction of FIG. 3A-3C) of the first and second metal carbide layers 143a and 143b.

As described above, since carbon originates from a hydrocarbon component included in a precursor of a metal element, carbon incorporation is inevitable as long as an atomic layer deposition method using an organometallic compound is used. According to the inventive concept, an effective work function may be lowered and a desired threshold voltage may be obtained by lowering a content of carbon that is inevitably included. The method of lowering the carbon content will be described in detail later.

Referring to FIG. 3B, the metal carbide layer 143 may have four layers. That is, the metal carbide layer 143 may include a first metal carbide layer 143a and a third metal carbide layer 143c which have a relatively high and uniform carbon concentration and a second metal carbide layer 143b and a fourth metal carbide layer 143d which have a relatively low and uniform carbon concentration.

Referring to FIG. 3C, the first metal carbide layer 143a has a constant carbon concentration as in FIG. 3A, whereas the second metal carbide layer 143b has a carbon concentration varying according to positions. Accordingly, excessive concentration of stress at a certain depth may be avoided. In FIG. 3C, while a carbon concentration of the second metal carbide layer 143b is illustrated as varying according to positions in the form of a concave curve, the carbon concentration may also vary linearly or in the form of a convex curve.

The inventive concept is not limited to the embodiments described above, and low-concentration metal carbide layers and high-concentration metal carbide layers may be included in the metal carbide layer 143 in various manners.

Figure 4A:
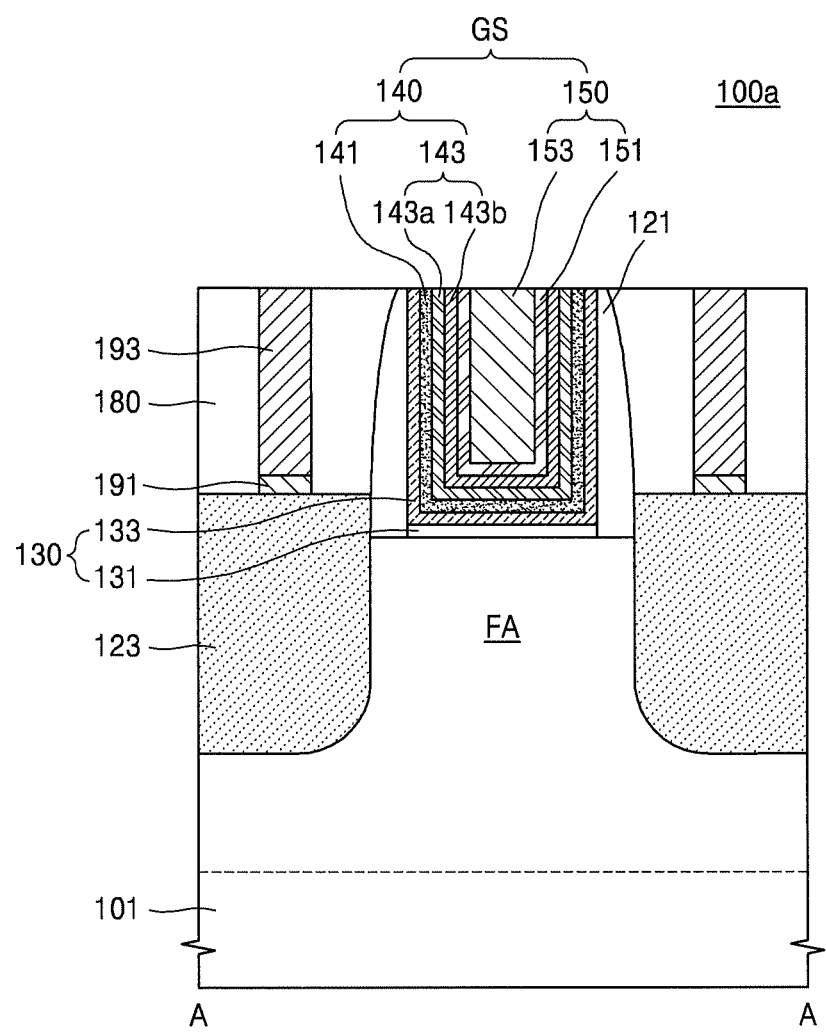
FIGS. 4A and 4B are cross-sectional views illustrating integrated circuit devices according to other embodiments of the inventive concept.
Figure 4B:
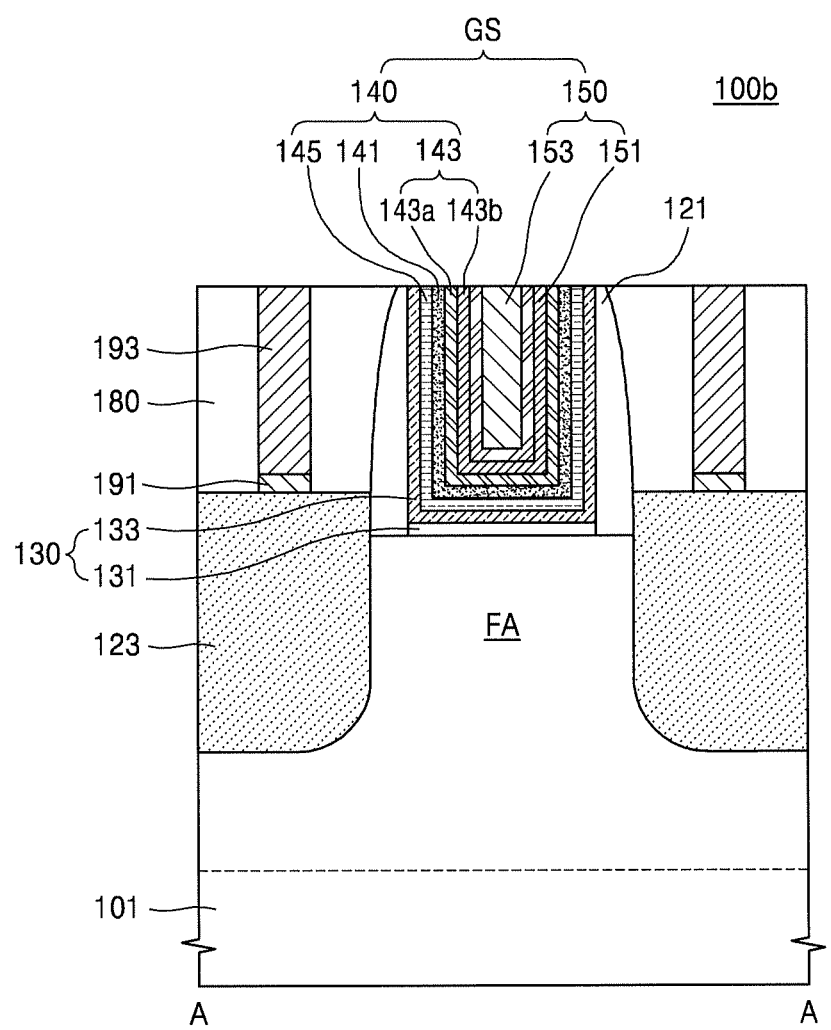

FIGS. 4A and 4B are cross-sectional views showing integrated circuit devices 100a and 100b according to other embodiments of the inventive concept.

First, referring to FIG. 4A, the integrated circuit device 100a is different from the integrated circuit device 100 illustrated in FIG. 1B in that it further includes a first work function adjusting nitride layer 141. Thus, description of common portions will be omitted here.

The work function adjusting layer 140 of the integrated circuit device 100a further includes a first work function adjusting nitride layer 141 in addition to the metal carbide layer 143. The first work function adjusting nitride layer 141 may be a nitride layer of a metal, and may be a nitride layer including at least one of titanium (Ti), tantalum (Ta), hafnium (Hf), tungsten (W), molybdenum (Mo), platinum (Pt), ruthenium (Ru), iridium (Ir), and aluminum (Al).

First, referring to FIG. 4B, the integrated circuit device 100b is different from the integrated circuit device 100a illustrated in FIG. 4A in that it further includes a second work function adjusting nitride layer 145. Thus, description of common portions will be omitted here.

The work function adjusting layer 140 of the integrated circuit device 100b further includes a second work function adjusting nitride layer 145 in addition to the metal carbide layer 143 and the first work function adjusting nitride layer 141. The second work function adjusting nitride layer 145 may be a nitride layer of a p-doped metal, and may be a p-doped nitride layer including at least one of titanium (Ti), tantalum (Ta), hafnium (Hf), tungsten (W), molybdenum (Mo), platinum (Pt), ruthenium (Ru), iridium (Ir), and aluminum (Al).

The first work function adjusting nitride layer 141 and the second work function adjusting nitride layer 145 may be adjusted in thickness and composition so that they have a desired work function. Furthermore, since an effective work function may be precisely controlled by using the first and second metal carbide layers 143a and 143b, an integrated circuit device giving higher performance may be obtained.

Figure 5:
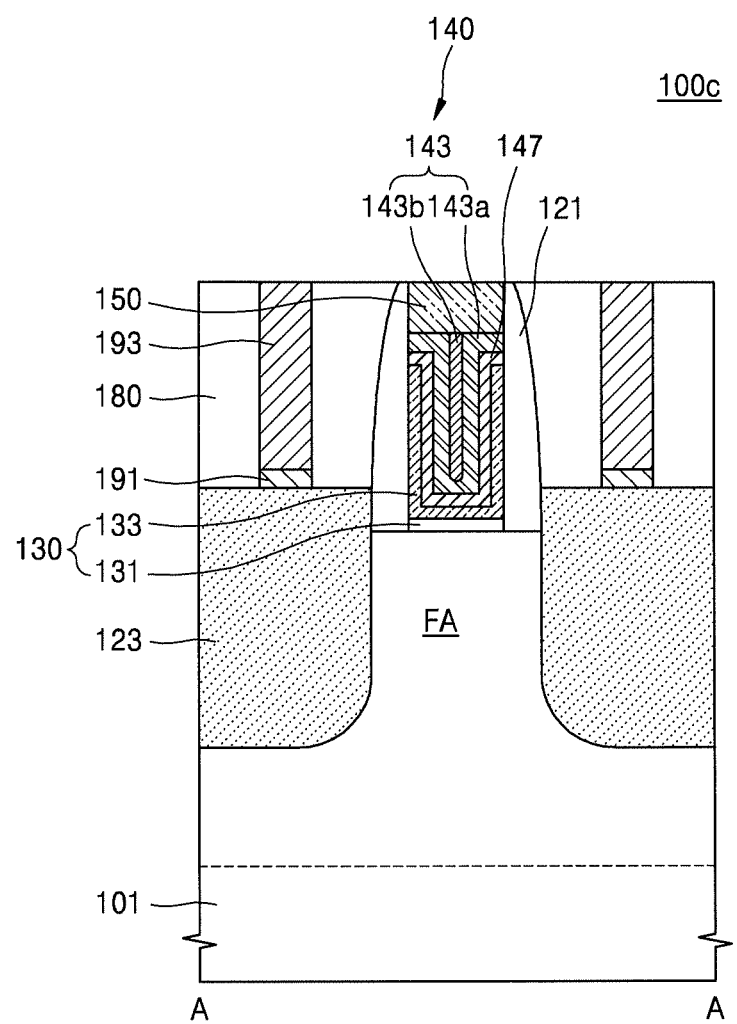
FIG. 5 is a cross-sectional view of an integrated circuit device according to other embodiments of the inventive concept.

FIG. 5 is a cross-sectional view of an integrated circuit device 100c according to other embodiments of the inventive concept.

Referring to FIG. 5, the integrated circuit device 100c has a shorter channel length than the integrated circuit devices 100a and 100b illustrated in FIGS. 4A and 4B. Accordingly, the thickness and number of layers that may be accommodated in a channel region may be restricted. In the integrated circuit devices 100a and 100b having a sufficient channel length, the gate electrode 150 may be accommodated in a recess defined by a metal carbide layer 143. However, in the case of the integrated circuit device 100c, since a recess is completely buried while forming the metal carbide layer 143, the gate electrode 150 is disposed on the metal carbide layer 143.

The metal carbide layer 143 may include a first metal carbide layer 143a and a second metal carbide layer 143b having different carbon concentrations. In some embodiments, the second metal carbide layer 143b may be received within a recess defined by the first metal carbide layer 143a. The second metal carbide layer 143b may fill the recess defined by the first metal carbide layer 143a.

In FIG. 5, the second metal carbide layer 143b is illustrated as having an I-shape, but it may also be formed to have a T-shape (not shown). When the second metal carbide layer 143b is formed to have a T-shape, the gate electrode 150 may contact a top surface of the second metal carbide layer 143b and may not contact a top surface of the first metal carbide layer 143a.

A barrier layer 147 may be interposed between the gate insulating layer 130 and the first metal carbide layer 143a. The barrier layer 147 may be formed of a single layer or a multi-layer of two or more layers. The barrier layer 147 may include a binary metal nitride such as titanium nitride (TiN), tantalum nitride (TaN), tungsten nitride (WN) or hafnium nitride (HfN) and a ternary metal nitride such as titanium aluminum nitride (TiAlN), tantalum aluminum nitride (TaAlN), or hafnium aluminum nitride (HfAlN).

Figure 6A:
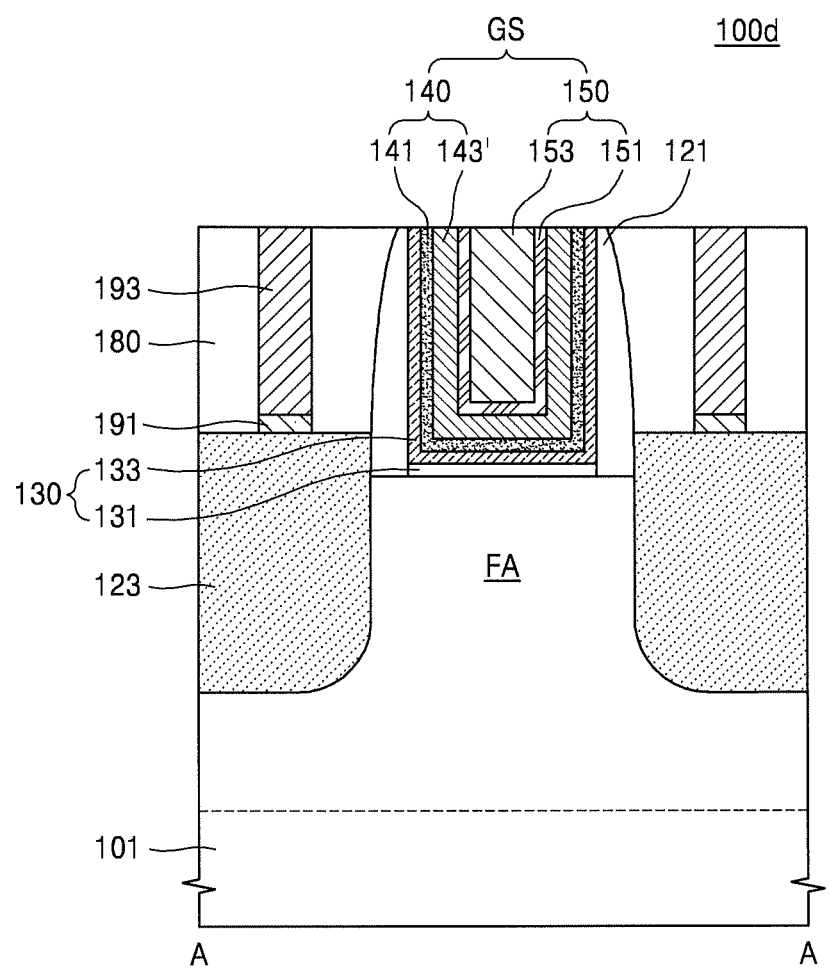
FIG. 6A is a cross-sectional view illustrating an integrated circuit device according to another embodiment of the inventive concept.
Figure 6B:
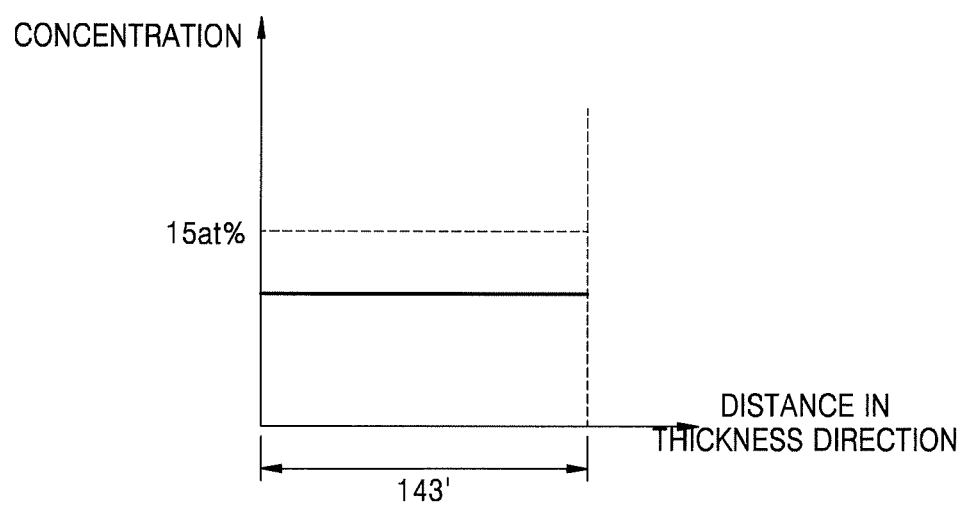
FIG. 6B is a graph showing a carbon concentration of a metal carbide layer of the integrated circuit device of FIG. 6A with respect to a thickness thereof.

FIG. 6A is a cross-sectional view illustrating an integrated circuit device 100d according to another embodiment of the inventive concept. FIG. 6B is a graph showing a carbon concentration of a metal carbide layer of the integrated circuit device 100d of FIG. 6A with respect to a distance in a thickness direction.

Referring to FIGS. 6A and 6B, the integrated circuit device 100d is the same as the integrated circuit device 100a illustrated in FIG. 4A except that a carbon concentration of a metal carbide layer 143' is uniform throughout. The integrated circuit device 100d in which a carbon concentration is substantially uniform over the entire thickness of the metal carbide layer 143' may be obtained by constant application of a process for reducing a carbon concentration in the metal carbide layer 143' throughout a process of forming the metal carbide layer 143'.

As a process for reducing the carbon concentration in the metal carbide layer 143' is constantly performed throughout the process of forming the metal carbide layer 143', the carbon concentration may be less than 15 at %. Accordingly, an effective work function may be reduced, and a thinner device may be manufactured.

It is easy to manufacture an integrated circuit device to be compact in size and to have a desired effective work function according to the inventive concept, and thus, device reliability of the integrated circuit device according to the inventive concept is excellent.

Figure 7A:
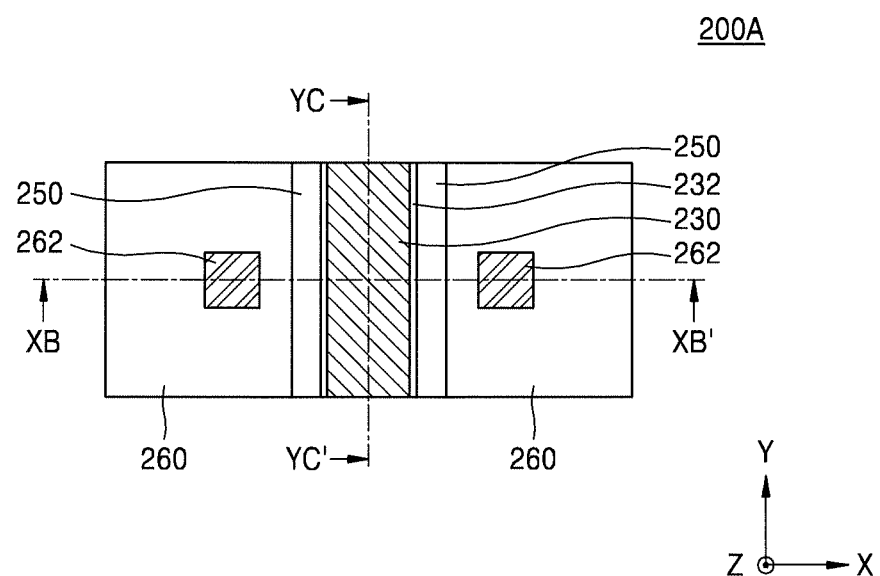
FIGS. 7A through 7C illustrate essential parts of an integrated circuit device according to another embodiment of the inventive concept.
Figure 7B:
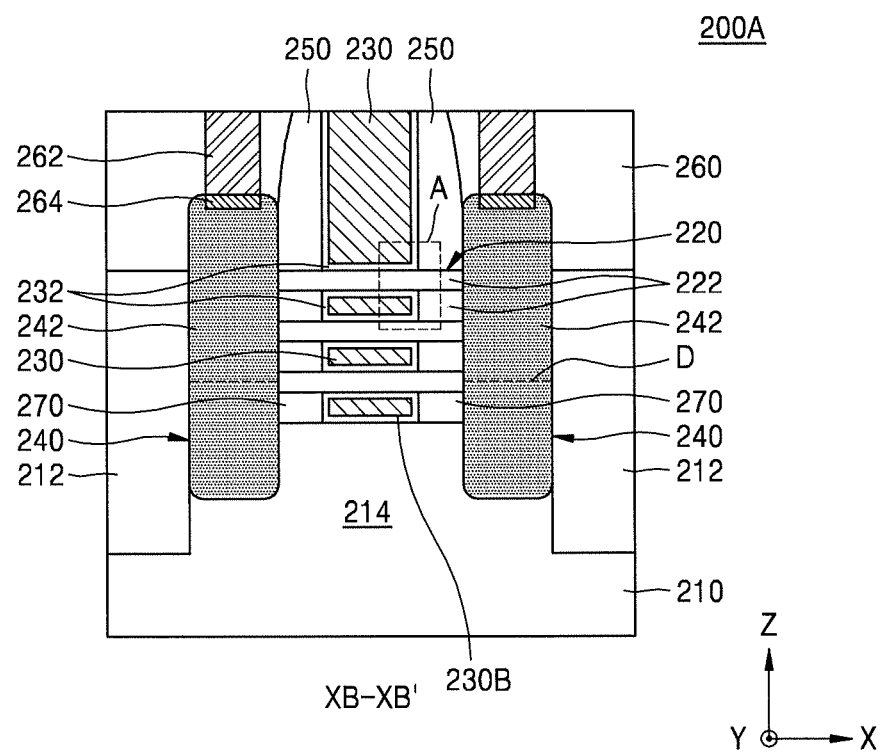
Figure 7C:
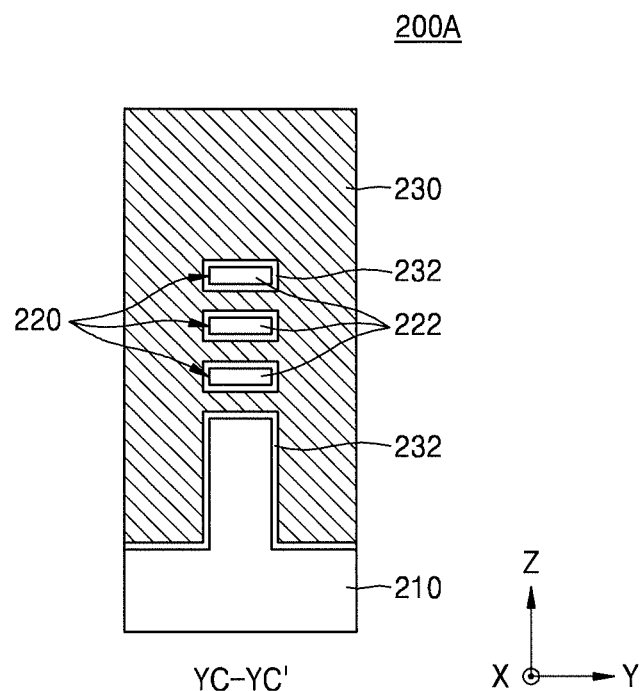

FIGS. 7A through 7C illustrate essential parts of an integrated circuit device 200A according to another embodiment of the inventive concept. In detail, FIG. 7A is a plan view of the integrated circuit device 200A. FIG. 7B is a cross-sectional view taken along line XB-XB' in FIG. 7A. FIG. 7C is a cross-sectional view taken along line YC-YC' in FIG. 7A.

FIGS. 7A through 7C, the integrated circuit device 200A includes a substrate 210, a nanosheet 220, or a plurality of nanosheets, that is spaced apart from the substrate 210 and extends in a direction (X direction) parallel to a direction in which a main surface of the substrate 210 extends, and a gate 230 surrounding at least a portion of the nanosheet 220.

In some embodiments, the substrate 210 may be a silicon substrate. In some embodiments, the substrate 210 may form a device selected from an image sensor such as a system large scale integration (LSI), a logic circuit, or a CMOS imaging sensor (CIS), a memory such as a flash memory, a DRAM, an SRAM, an EEPROM, a PRAM, an MRAM, or an RRAM, or a micro-electro-mechanical system (MEMS).

An active region 214 is defined in the substrate 210 by an insulating layer 212. A plurality of wells may be formed in the active region 214 of the substrate 210.

The nanosheet 220, or each of the plurality of nanosheets, includes a channel region 222. The gate 230 surrounds at least a portion of the channel region 222 of the nanosheet 220.

The nanosheet 220 may be formed of a group IV semiconductor, a group IV-IV compound semiconductor, or a group III-V compound semiconductor. In some embodiments, the nanosheet 220 may be formed of Si, Ge, or SiGe. In some other embodiments, the nanosheet 220 may be formed of InGaAs, InAs, GaSb, InSb, or a combination thereof.

A gate insulating layer 232 is interposed between the channel region 222 of the nanosheet 220 and the gate 230.

In some embodiments, the gate insulating layer 232 may be formed of a silicon oxide layer, a silicon oxynitride layer, a high-k dielectric layer having a higher permittivity than a silicon oxide layer, or a combination thereof. For example, examples of the high-k dielectric layer that may be used in the gate insulating layer 232 may include, without limitation, $HfO_2$, HfSiO, HfSiON, HfTaO, HfTiO, HfZrO, zirconium oxide, aluminum oxide, and $HfO_2$—$Al_2O_3$ alloy, or a combination thereof.

In some embodiments, the gate 230 may include doped polysilicon, metal, or a combination thereof. For example, the gate 230 may be formed of Al, Cu, Ti, Ta, W, Mo, TaN, NiSi, CoSi, TiN, WN, TiAl, TiAlN, TaCN, TaC, TaSiN, or a combination thereof, but is not limited thereto.

A pair of semiconductor layers 240 extending to both ends of the nanosheet 220 are formed on the substrate 210 along a direction (Z direction) perpendicular to the main surface of the substrate 210. In some embodiments, the semiconductor layer 240 may be formed of a SiGe layer, a Ge layer, a SiC layer, or an InGaAs layer, but is not limited thereto.

The semiconductor layer 240 may be formed of a semiconductor layer regrown from the substrate 210 and the nanosheet 220 by an epitaxy process. In some embodiments, the semiconductor layer 240 may be formed of a material different from those of the substrate 210 and the nanosheet 220.

Each of the pair of semiconductor layers 240 includes an impurity region 242. The impurity region 242 may be formed by implanting N-type impurity ions or P-type impurity ions into the semiconductor layer 240. The impurity region 242 may be formed to a depth D indicated by a dotted line. For example, the impurity region 242 may include, without limitation, a doped SiGe layer, a doped Ge layer, a doped SiC layer, or a doped InGaAs layer.

In some embodiments, the depth D may be at a higher level than a bottom surface 230B of the gate 230 that is closest to the substrate 210, as shown in FIG. 7B. However, the inventive concept is not limited to the illustrated example.

The pair of impurity regions 242 formed in the pair of semiconductor layers 240 are in contact with the two ends of the nanosheet 220 and may extend to a higher level than the nanosheet 220 in a direction perpendicular to the main surface of the substrate 210 (Z direction).

The two ends of the nanosheet 220 adjacent to the impurity region 242 are covered by an outer insulating spacer 250 covering sidewalls of the gate 230.

Since the outer insulating spacer 250 is substantially identical to the insulating spacer 121 described with reference to FIGS. 1A and 1B, detailed description thereof will be omitted here.

The impurity region 242 and a portion of the outer insulating spacer 250 are covered by an interlayer insulating layer 260. The impurity region 242 is connected to a contact 262 penetrating the interlayer insulating layer 260. A metal silicide layer 264 may be formed between the impurity region 242 and the contact 262. As the metal silicide layer 264 is formed on a surface of the impurity region 242, resistances of the impurity region 242 and resistance of the contact 262 may be reduced. In some embodiments, the metal silicide layer 264 may be formed of a cobalt silicide layer, but is not limited thereto. In some embodiments, the metal silicide layer 264 may be omitted.

A pair of inner insulating spacers 270 is formed between the substrate 210 and the nanosheet 220. The pair of inner insulating spacers 270 is interposed between the gate 230 and the impurity region 242. The inner insulating spacer 270 may be formed of a different material from that of the gate insulating layer 232.

Between the substrate 210 and the nanosheet 220, the gate insulating layer 232 extends from a surface of the channel region 222 of the nanosheet 220 to a surface of a sidewall of the inner insulating spacer 270 so as to be interposed between the gate 230 and the inner insulating spacer 270.

In some embodiments, the inner insulating spacer 270 may be formed of a material different from that of the gate insulating layer 232. In some embodiments, the inner insulating spacer 270 may be formed of a material having a smaller permittivity than a material constituting the gate insulating layer 232. In some embodiments, the inner insulating spacer 270 may be formed of an oxide of a group IV semiconductor, an oxide of a group IV-V compound semiconductor, an oxide of a group III-V compound semiconductor, or silicon oxide. For example, the inner insulating spacer 270 may be formed of an oxide of SiGe, an oxide of InP, or silicon oxide, but is not limited thereto.

The outer insulating spacer 250 and the inner insulating spacer 270 are formed at different levels on the substrate 210 at positions vertically overlapping each other along a direction (Z direction) perpendicular to a direction in which a main surface of the substrate 210 extends. In some embodiments, the inner insulating spacer 270 may be formed of a different material from a material that constitutes the outer insulating spacer 250. In some embodiments, the inner insulating spacer 270 may be formed of a material having a smaller permittivity than a material constituting the outer insulating spacer 250.

The integrated circuit device 200A may constitute a transistor. In some embodiments, when an N-type well is formed in the active region 214 of the substrate 210, and a P-type impurity is doped into the semiconductor layer 240 to form source/drain region, the integrated circuit device 200A may be a PMOS transistor. In some other embodiments, when a P-type well is formed in the active region 214 of the substrate 210 and an N-type impurity is doped into the semiconductor layer 240 to form source/drain region, the integrated circuit device 200A may be an NMOS transistor.

Carrier mobility of a MOS transistor has a great influence on power consumption and switching performance of a device. By improving carrier mobility, a switching speed may be increased and low-voltage operation is enabled, which allows reduction in power consumption. In some embodiments, the channel region 222 of the nanosheet 220 may have a strained channel in order to improve carrier mobility in the integrated circuit device 200A constituting a MOS transistor.

In an example, when the integrated circuit device 200A constitutes a PMOS transistor, in order to provide a nanosheet 220 having a strained channel, the nanosheet 220 may be formed of Si, and the pair of impurity regions 242 connected to the two ends of the nanosheet 220 may be formed of doped SiGe or doped Ge. In another example, when the integrated circuit device 200A constitutes a PMOS transistor, in order to provide a nanosheet 220 having a strained channel, the nanosheet 220 may be formed of Ge, and the pair of impurity regions 242 may be formed of SiGe. In another example, when the integrated circuit device 200A constitutes an NMOS transistor, in order to provide a nanosheet 220 having a strained channel, the nanosheet 220 may be formed of Si, and the pair of impurity regions 242 may be formed of doped SiC.

Figure 8A:
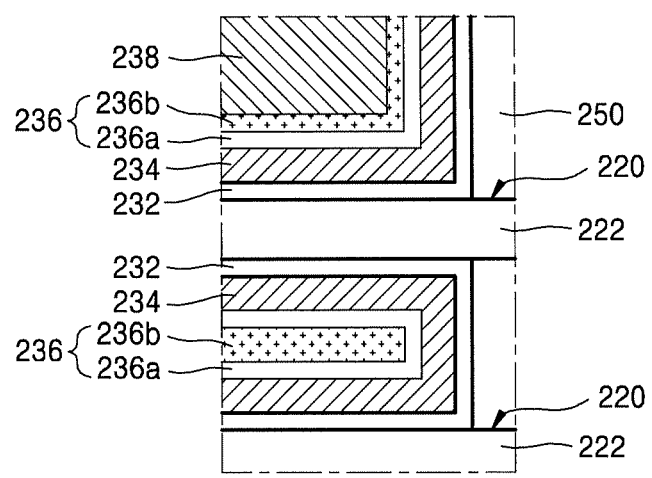
FIGS. 8A and 8B are partially enlarged views of a portion A of FIG. 7B.
Figure 8B:
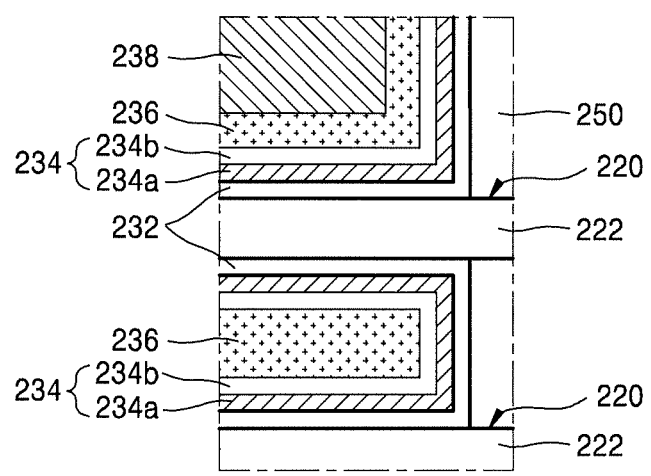

FIGS. 8A and 8B are partially enlarged views of a portion A of FIG. 7B.

Referring to FIG. 8A, portions of the gate 230 that are inserted into a space between the channel regions 222 are shown in more detail.

The gate 230 may include a metal layer 238, a metal carbide layer 236, and a metal nitride layer 234. As the manufacture of the gate 230 follows the order in which layers are stacked on a top surface of the channel region 222, which is at an uppermost level, it is apparent from FIG. 8A that the metal nitride layer 234, the metal carbide layer 236, and the metal layer 238 are formed sequentially in this order. However, since a space between the two channel regions 222, in particular, a vertical width of the space, is narrow, when the metal carbide layer 236 is formed after forming the metal nitride layer 234, the space between the two channel regions 222 may be completely filled. Accordingly, the metal layer 238 may not be formed in the space between the two channel regions 222. However, the inventive concept does not exclude formation of the metal layer 238 in the space between the two channel regions 222.

The metal carbide layer 236 may include a first metal carbide layer 236a and a second metal carbide layer 236b having different carbon contents. The first metal carbide layer 236a may be formed to be substantially conformal along a surface of the metal nitride layer 234. The second metal carbide layer 236b may be formed substantially conformally along a surface of the first metal carbide layer 236a.

In the space between the two channel regions 222, the first metal carbide layer 236a may extend substantially conformally along the surface of the metal nitride layer 234 to thereby form a void in a center. In some embodiments, the second metal carbide layer 236b may fill the void.

In some embodiments, a carbon concentration of the first metal carbide layer 236a may be from about 0.01 at % to about 15 at %, and a carbon concentration of the second metal carbide layer 236b may be from about 15 at % to about 30 at %, higher than the carbon concentration of the first metal carbide layer 236a. In another embodiment, a carbon concentration of the first metal carbide layer 236a may be higher than a carbon concentration of the second metal carbide layer 236b.

In some embodiments, a nitrogen content of the metal nitride layer 234 may be from about 1 at % to about 30 at %. In other embodiments, a nitrogen content of the metal nitride layer 234 may be from about 5 at % to about 40 at %.

Referring to FIG. 8B, the metal nitride layer 234 may include a first metal nitride layer 234a and a second metal nitride layer 234b having different nitrogen contents. The first metal nitride layer 234a may extend substantially conformally along a surface of the gate insulating layer 232. The second metal nitride layer 234b may extend substantially conformally along a surface of the first metal nitride layer 234a.

In the space between the two channel regions 222, the metal nitride layer 234 may extend substantially conformally along the surface of the gate insulating layer 232 to form a void in a center. In some embodiments, the metal carbide layer 236 may fill the void.

In some embodiments, a nitrogen concentration of the first metal nitride layer 234a may be from about 1 at % to about 30 at %, and a nitrogen concentration of the second metal nitride layer 234b may be from about 5 at % to about 40 at %, which is higher than the nitrogen concentration of the first metal nitride layer 234a. In another embodiment, a nitrogen concentration of the first metal nitride layer 234a may be higher a nitrogen concentration of the second metal nitride layer 234b.

In some embodiments, a carbon content of the metal carbide layer 236 may be from about 1 at % to about 30 at %.

It will be understood by those of ordinary skill in the art that the embodiment illustrated in FIG. 8A and the embodiment illustrated in FIG. 8B may be combined with each other. In this case, it will be understood that each of the metal carbide layer 236 and the metal nitride layer 234 may include two layers each having different carbon and nitrogen concentrations compared to the other.

FIGS. 9A through 9F are cross-sectional views illustrating a method of manufacturing an integrated circuit device, such as, for example, the integrated circuit device 100 as depicted in FIGS. 1A and 1B, according to an embodiment of the inventive concept.

FIGS. 9A through 9F are cross-sectional views sequentially illustrating a method of manufacturing a semiconductor device according to an embodiment of the inventive concept. In FIGS. 9A through 9F, cross-sections AA and BB respectively denote the cross-sections AA and BB of FIG. 1A.

Figure 9A:
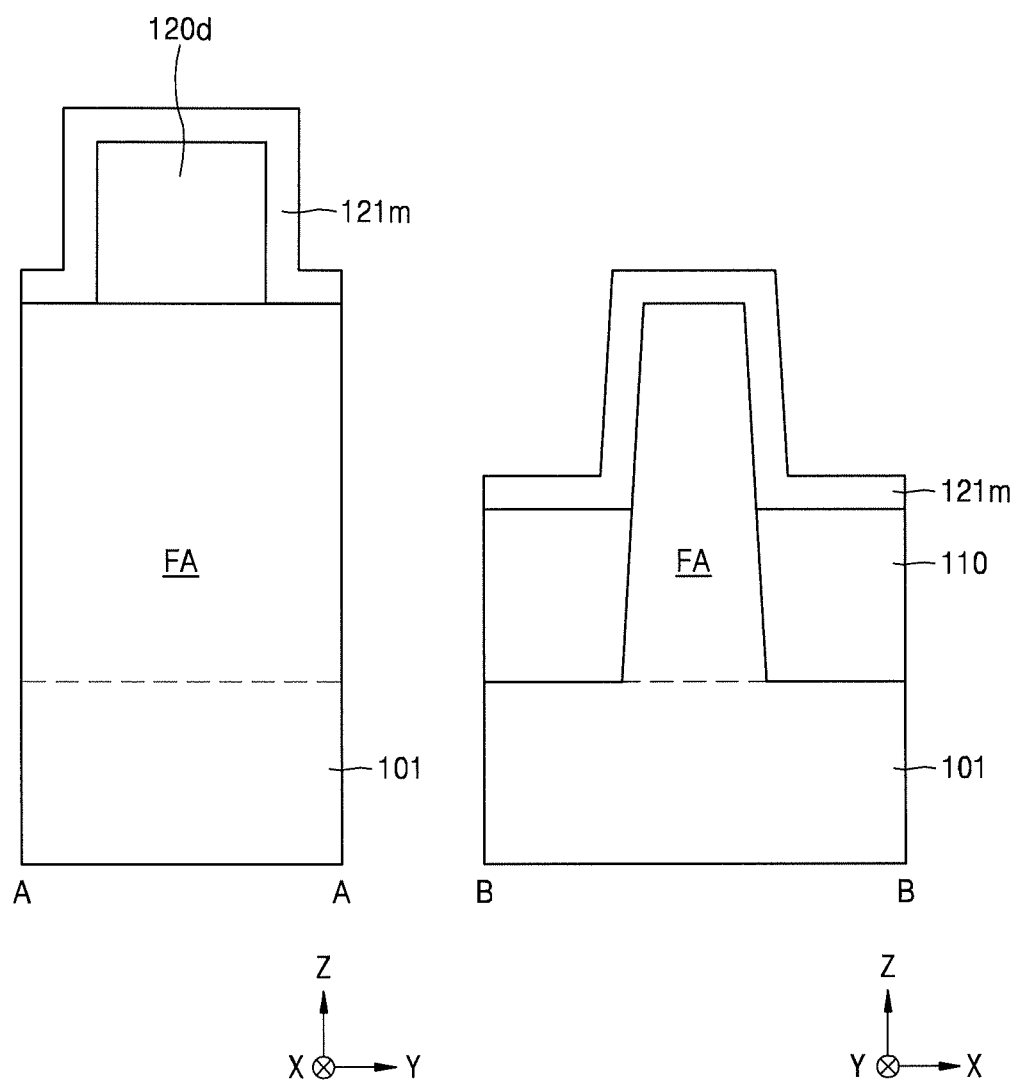
FIGS. 9A through 9F are cross-sectional views illustrating a method of manufacturing an integrated circuit device, according to an embodiment of the inventive concept.

Referring to FIG. 9A, a dummy gate electrode 120d may be formed on a semiconductor substrate 101 on which a fin-type active region FA is defined by a device isolation layer 110, and then a spacer material layer 121m may be deposited on the entire surface of the semiconductor substrate 101 and the entire surface of the dummy gate electrode 120d.

The semiconductor substrate 101 has been described above with reference to FIG. 1, and thus further description thereof will be omitted here.

The dummy gate electrode 120d may be formed of, for example, polysilicon, but is not limited thereto. The dummy gate electrode 120d may be provided to secure a position and a space for forming a gate electrode later.

The spacer material layer 121m may include the low-permittivity material layer described above, and the same material as the insulating spacer 121 described with reference to FIG. 1 may be used as the spacer material layer 121m.

Figure 9B:
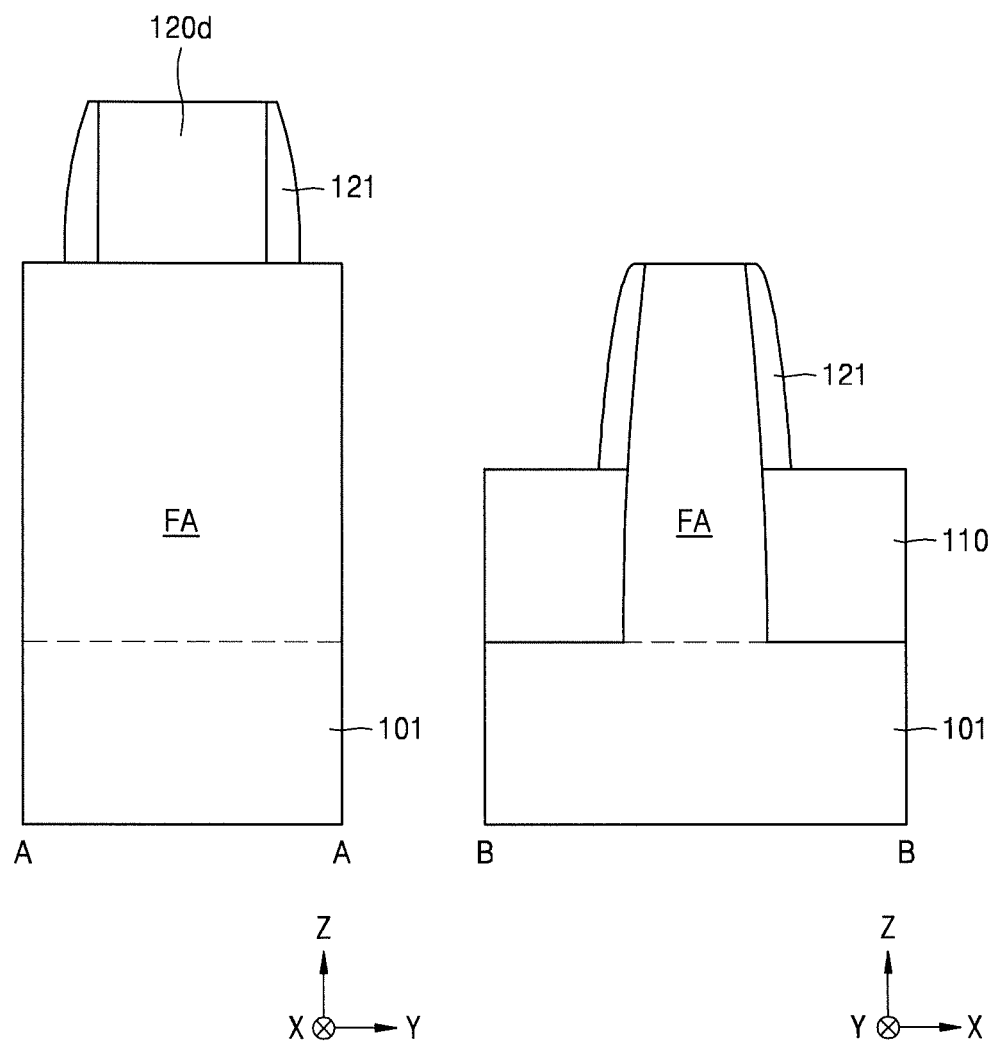

Referring to FIG. 9B, the insulating spacer 121 is formed by anisotropically etching the spacer material layer 121m. The insulating spacer 121 may be formed on a sidewall of the dummy gate electrode 120d. The insulating spacer 121 may also be formed on sidewalls of the fin-type active region FA on both sides of the dummy gate electrode 120d.

Figure 9C:
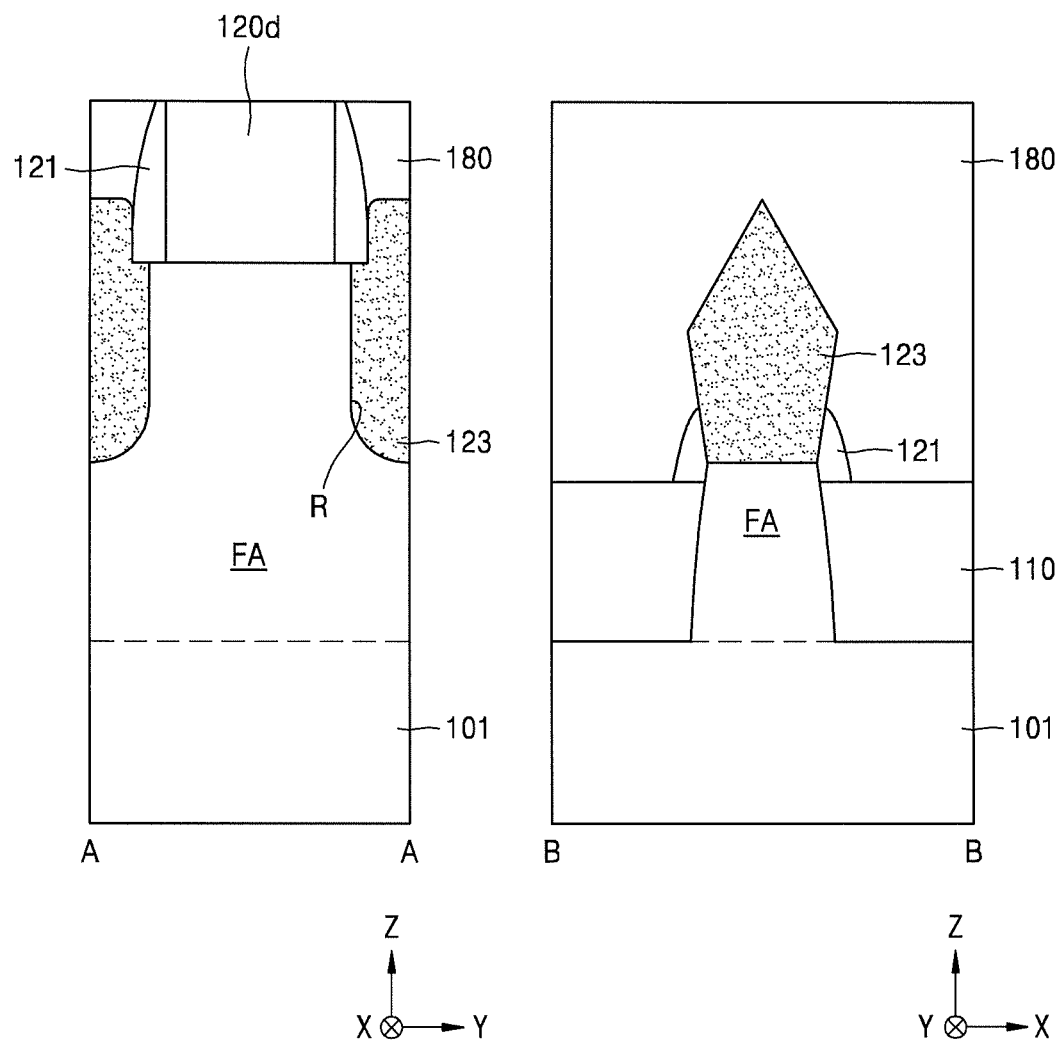

Referring to FIG. 9C, the fin-type active region FA may be partially removed by using the dummy gate electrode 120d and the insulating spacer 121 as an etching mask.

Anisotropic etching and/or isotropic etching may be performed to partially remove the fin-type active region FA. In particular, partial etching may be performed by combining anisotropic etching and isotropic etching to expose at least a portion of a lower surface of the insulating spacer 121 formed on the sidewall of the dummy gate electrode 120d.

In detail, anisotropic etching may be performed on the exposed fin-type active region FA at a predetermined depth, and isotropic etching may be performed by wet etching. Examples of an etchant for the wet etching may include a NH₄OH solution, a trimethyl ammonium hydroxide (TMAH), a HF solution, a NH₄F solution or a mixture thereof, but are not limited thereto.

A recess is formed by anisotropic etching where the insulating spacer 121 is used as an etching mask, and a recess R that exposes a portion of the lower surface of the insulating spacer 121 as illustrated in FIG. 9C may be obtained by further performing the wet etching on the recess. In particular, the recess R may expose at least a portion of the lower surface of the insulating spacer 121 at an impurity region.

In some embodiments, wet etching that is performed to expose a portion of the lower surface of the insulating spacer 121 may be omitted.

Next, a source/drain material layer may be formed in the recess R to form the impurity region 123. The source/drain material layer may be formed of Si, SiC, or SiGe, but the inventive concept is not limited thereto. The source/drain material layer may be formed, for example, by epitaxial growth. An impurity may be implanted in situ during epitaxial growth of the source/drain material layer or through ion implantation after the source/drain material layer is formed. Further, the impurity region 123 may have a top surface that is at a higher level than the top surface of the fin-type active region FA.

Then, an interlayer insulating layer 180 may be formed on the impurity region 123. The interlayer insulating layer 180 may be, for example, silicon oxide, but is not limited thereto.

Figure 9D:
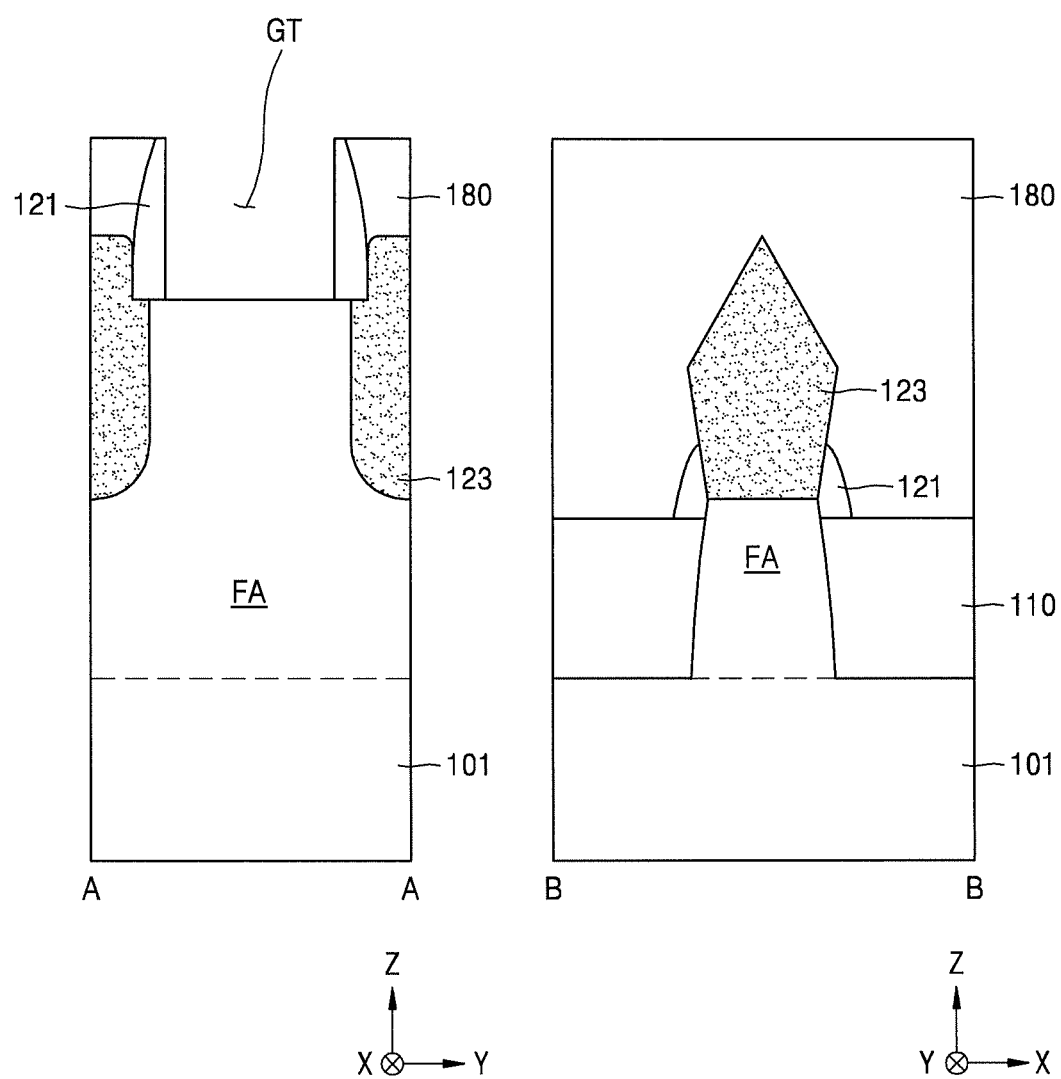

Referring to FIG. 9D, the dummy gate electrode 120d may be removed to form a gate trench GT. A portion of the top surface of the semiconductor substrate 101 may be exposed by the gate trench GT. A portion of the semiconductor substrate 101 exposed by the gate trench GT may correspond to a channel region of a semiconductor device to be manufactured later.

The dummy gate electrode 120d may be removed by, for example, dry etching or wet etching.

Figure 9E:
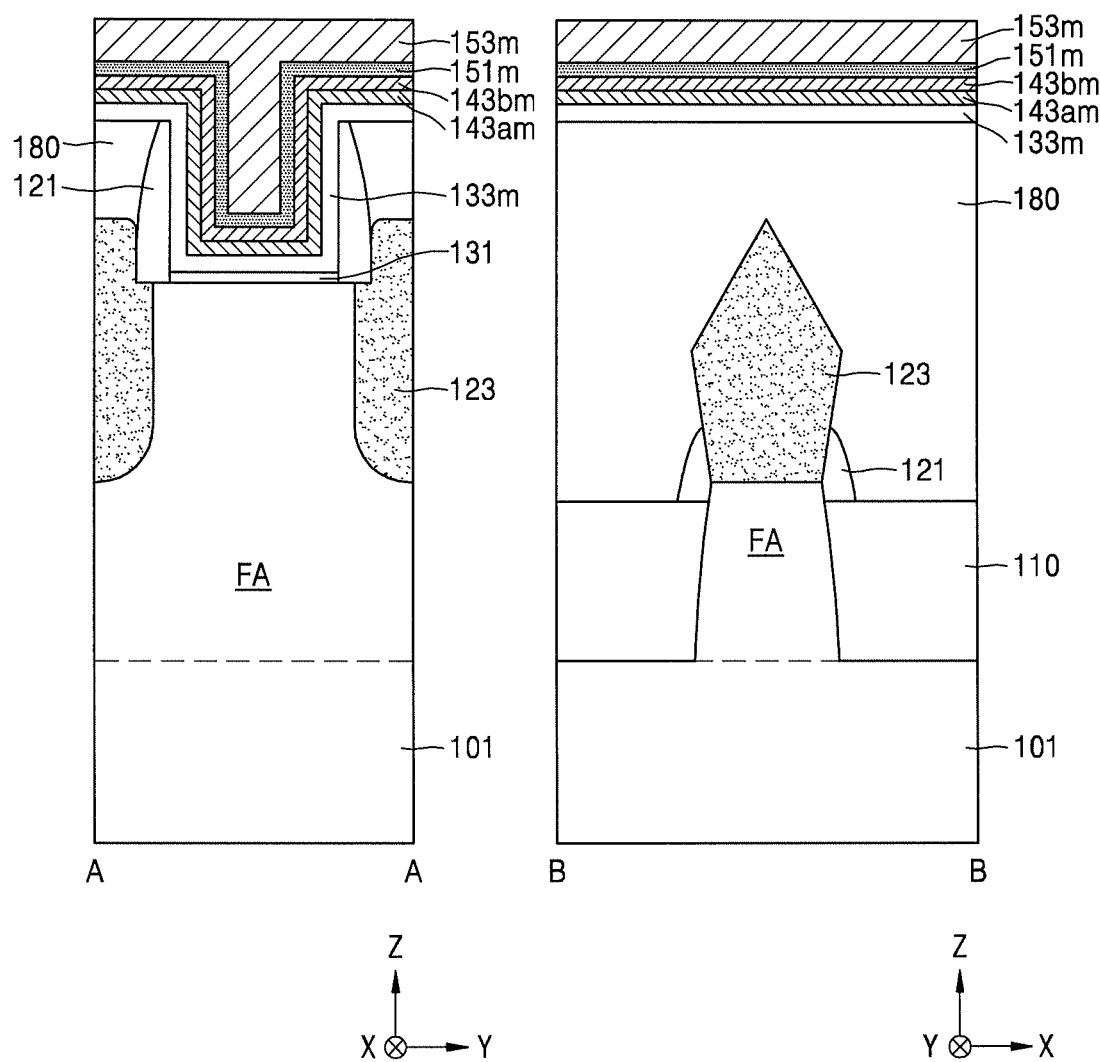

Referring to FIG. 9E, an interface layer 131 may be formed in the gate trench GT. Next, a high-k material layer 133m, a first metal carbide material layer 143am, a second metal carbide material layer 143bm, a barrier material layer 151m, and a gap fill metal material layer 153m are respectively sequentially formed on the interface layer 131, a sidewall of the gate trench GT, and a top surface of the interlayer insulating layer 180. In particular, each of the high-k material layer 133m, the first metal carbide material layer 143am, the second metal carbide material layer 143bm, and the barrier material layer 151m may be conformally formed to along a surface thereunder. In addition, the gap fill metal material layer 153m may be formed to fill a trench formed by the barrier material layer 151m.

The high-k material layer 133m, the first metal carbide material layer 143am, the second metal carbide material layer 143bm, the barrier material layer 151m, and the gap fill metal material layer 153m may be independently formed through an atomic layer deposition (ALD), chemical vapor deposition (CVD), or PVD process. However, the method of forming the above layers is not limited thereto. In some embodiments, at least one of the first metal carbide material layer 143am and the second metal carbide material layer 143bm may be formed by an ALD process using remote hydrogen plasma treatment.

Figure 9F:
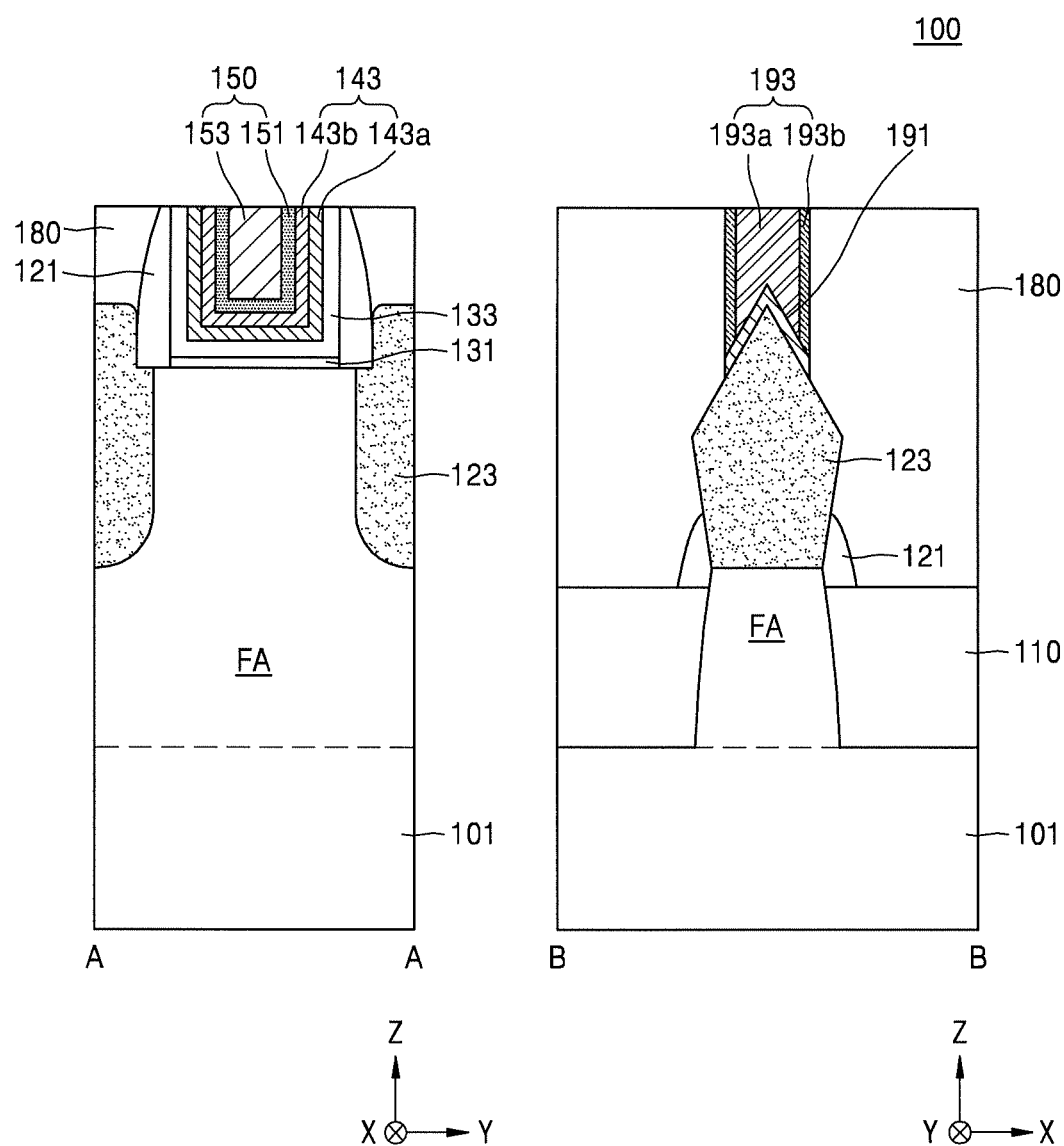

Referring to FIG. 9F, the integrated circuit device 100 as illustrated in FIGS. 1A and 1B may be finally obtained by planarizing a top surface of the gap fill metal material layer 153m, the barrier material layer 151m, the second metal carbide material layer 143bm, the first metal carbide material layer 143am, and the high-k material layer 133m until the top surface of the interlayer insulating layer 180 is exposed, and forming a contact 193. The planarization may be performed, for example, by chemical mechanical polishing (CMP). However, the method of planarization is not limited thereto.

The contact 193 may be connected to the impurity region 123 which forms a source/drain region. The contact 193 may include a conductive barrier layer 193b and a wiring layer 193a. In some embodiments, the conductive barrier layer 193b may be formed of titanium nitride, tantalum nitride, tungsten nitride, titanium carbon nitride, or a combination thereof, but is not limited thereto. In some embodiments, the wiring layer 193a may be formed of a doped semiconductor, a metal such as Cu, Ti, W, or Al, a metal silicide such as nickel silicide, cobalt silicide, tungsten silicide, or tantalum silicide, or a combination thereof, but is not limited thereto. The gate electrode 150 and the contact 193 may be electrically insulated from each other by the interlayer insulating layer 180.

While FIGS. 9A through 9F illustrate that the source/drain region, which is an impurity region, has a RSD structure, the inventive concept is not limited thereto. For example, the impurity region 123 may be an impurity doped region formed in a region corresponding to the fin-type active region FA.

Figure 10A:
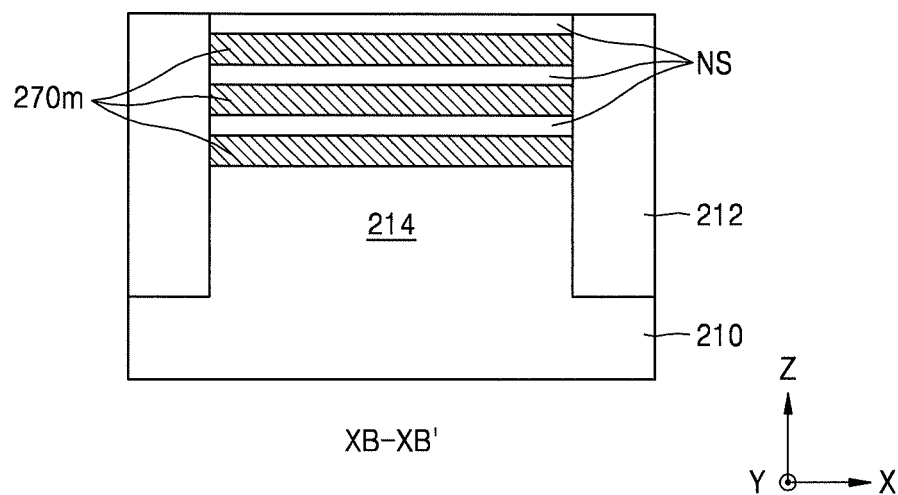
FIGS. 10A through 10C are side cross-sectional views illustrating a method of manufacturing an integrated circuit device, according to another embodiment of the inventive concept.
Figure 10B:
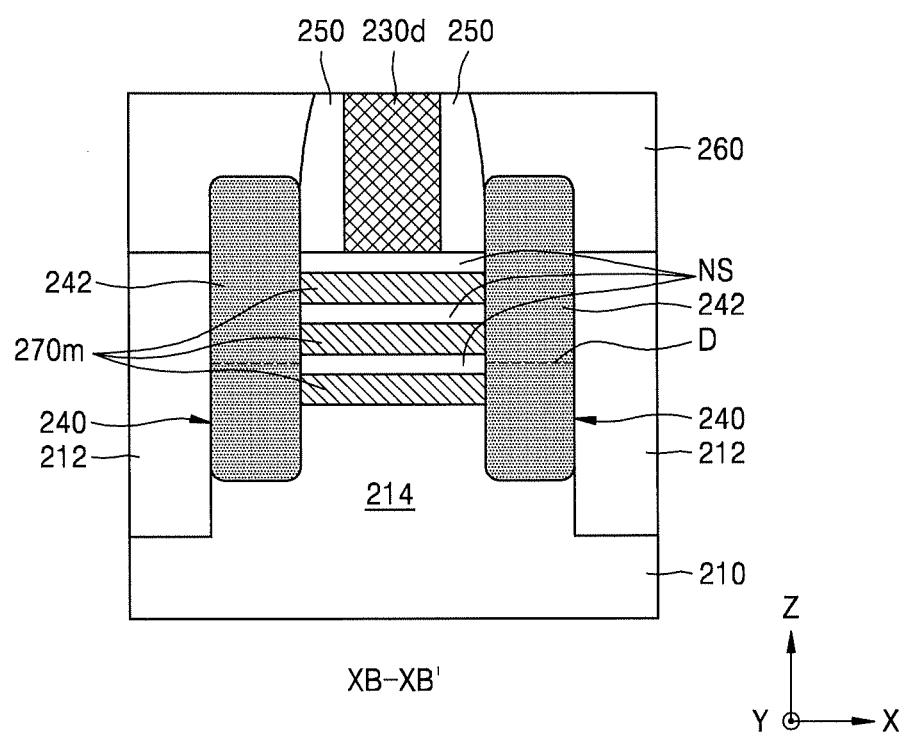
Figure 10C:
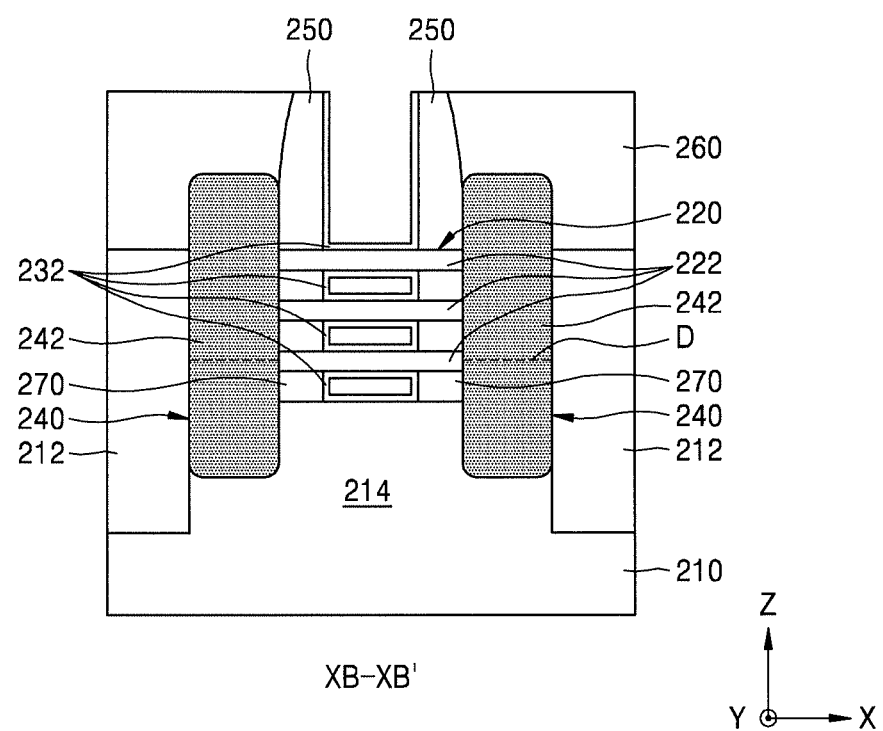

FIGS. 10A through 10C are side cross-sectional views illustrating a method of manufacturing an integrated circuit device, such as, for example, the integrated circuit device 200A as depicted in FIGS. 7A-7C, according to another embodiment of the inventive concept.

Referring to FIG. 10A, a plurality of sacrificial layers 270m and a plurality of nanosheet semiconductor layers NS are alternately stacked and patterned on a substrate 210 to define an active region 214. For example, the sacrificial layer 270m may be SiGe, and the nanosheet semiconductor layer NS may be formed of Si. However, the inventive concept is not limited thereto.

Next, an insulating layer 212 is formed in a recess formed by the patterning.

The insulating layer 212 may be formed of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but is not limited thereto.

Referring to FIG. 10B, after forming a dummy gate 230*d*, an outer insulating spacer 250 is formed on both sides of the dummy gate 230*d*, and exposed portions of the sacrificial layer 270*m* and the nanosheet semiconductor layer NS may be etched using the outer insulating spacer 250 as an etch mask.

An impurity region 242 which will be formed as a source/drain region may then be formed through epitaxial growth.

Referring to FIG. 10C, after removing the dummy gate 230*d* and the sacrificial layer 270*m*, and forming inner insulating spacers 270, a gate insulating layer 232 may be formed on portions exposed after removal of the dummy gate 230*d*.

By further forming a gate 230, which may include a metal nitride layer 234 and metal carbide layer 236, and forming a metal silicide layer 264 and contact 262, the integrated circuit device 200A as illustrated in FIGS. 7A-7C may be obtained.

Figure 11A:
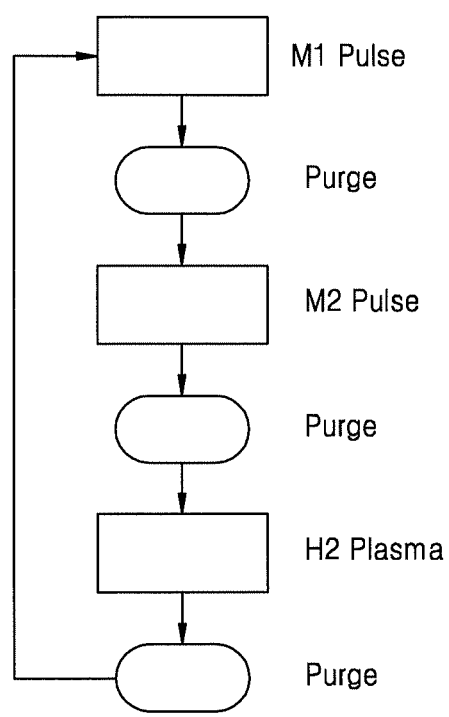
FIGS. 11A and 11B are block diagrams illustrating a method of forming a metal carbide layer.
Figure 11B:
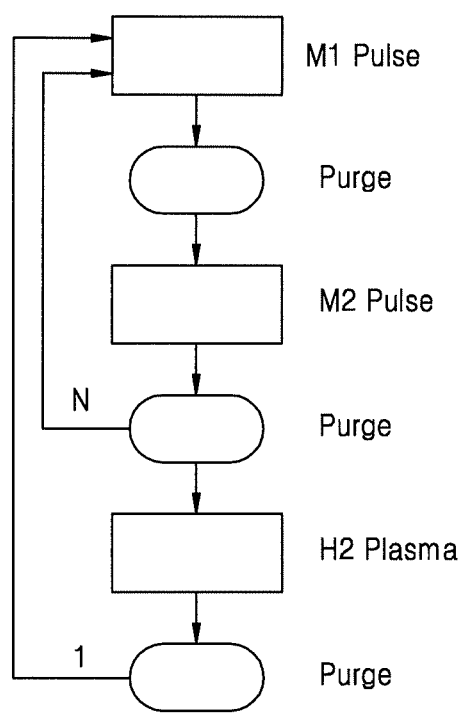

FIGS. 11A and 11B are block diagrams illustrating a method of forming the metal carbide layer 236.

FIG. 11A illustrates a cycle for forming a material layer, such as a metal carbide layer or a metal nitride layer, by using an atomic layer deposition (ALD) method according to an embodiment of the inventive concept. Therefore, the cycle of FIG. 11A may be repeated until a material layer of a desired thickness is formed.

A metal precursor of a first metal M1 may be pulsed in a reaction chamber in which a semiconductor substrate is loaded, to thereby adsorb the metal precursor of the first metal M1 to: the semiconductor substrate; or a layer on the semiconductor substrate. The first metal M1 may include any metal to be formed on an exposed surface of the semiconductor substrate, and the metal may be, for example, titanium (Ti), tantalum (Ta) tungsten (W), aluminum (Al), ruthenium (Ru), niobium (Nb), molybdenum (Mo), hafnium (Hf), lanthanum (La), vanadium (V), nickel (Ni), cobalt (Co), platinum (Pt), ytterbium (Yb), terbium (Tb), dysprosium (Dy), erbium (Er), or palladium (Pd).

The metal precursor of the first metal M1 may be an organometallic compound in which the first metal M1 is bonded to a hydrocarbon moiety. In particular, the first metal M1 may be bonded to the hydrocarbon moiety through coordinate bond.

As a result of the pulsing, the metal precursor of the first metal M1 may be firmly bonded to the semiconductor substrate through chemisorption, wherein molecules of the metal precursor of the first metal M1 that are in direct contact with the semiconductor substrate form a monolayer. However, an excess amount the metal precursor of the first metal M1 may be weakly adsorbed on the monolayer, which may be removed through a subsequent purge process.

Next, a monolayer including the first metal M1 may be formed by exposing the chemisorbed metal precursor of the first metal M1 to a reactant. For example, carbon originating from the hydrocarbon moiety may be incorporated into the monolayer including the first metal M1.

Subsequently, a monolayer including a second metal M2 may be formed on the monolayer including the first metal M1 by pulsing the monolayer including the first metal M1 with a metal precursor of a second metal M2, removing an excess amount of the metal precursor of the second metal M2 through a subsequent purge process, and exposing the metal precursor to the second metal M2 to a reactant to form a monolayer including the second metal M2. The second metal precursor may include aluminum (Al).

Next, a hydrogen plasma treatment is performed by supplying hydrogen plasma formed using a remote method. Although the inventive concept is not limited by any particular theory, it is conjectured that the previously incorporated carbon reacts with hydrogen during the hydrogen plasma treatment to be vaporized and removed, for example, in the form of methane ($CH_4$). In other words, the content of carbon of the material layer may be reduced by performing the hydrogen plasma treatment.

By repeating this process, a metal carbide layer may be formed.

When forming a metal nitride layer, a treatment for forming a metal nitride layer may be performed on a metal precursor material, and then nitrogen plasma treatment may be performed thereon. By performing nitrogen plasma treatment where nitrogen plasma is generated using a remote method, the content of nitrogen in the metal nitride layer may be increased.

FIG. 11B illustrates a cycle for forming a material layer by using an ALD method according to another embodiment of the inventive concept. A sub-cycle that does not undergo plasma treatment exists during the cycle, and the cycle of forming a material layer described above may be applied such that the entire cycle is performed once as the sub-cycle is performed N times.

For example, after performing a sub-cycle twice, hydrogen plasma treatment (nitrogen plasma treatment in the case of forming a metal nitride layer) may be performed once, thereby completing one cycle.

Likewise, the cycle of FIG. 11B may be repeated until a material layer of a desired thickness is formed.

Since the method of forming a layer including the first metal M1 and forming a layer including the second metal M2 has been described above, detailed description thereof will be omitted here. However, if the number of circulation of the sub-cycle does not reach N even after the adsorption and reaction of the second metal precursor of metal M2 has ended, then the method returns to the adsorption and reaction process of the first metal precursor of metal M1 without performing a plasma treatment. N may be an integer greater than 1.

Those of ordinary skill in the art will be aware of various deposition methods through combination or alteration of the methods described with reference to FIGS. 11A and 11B. In particular, those of ordinary skill in the art will be aware that the methods described with reference to FIGS. 11A and 11B may be suitably combined to attain a gradual change in carbon content as shown in FIG. 2 or FIG. 3C.

Figure 12A:
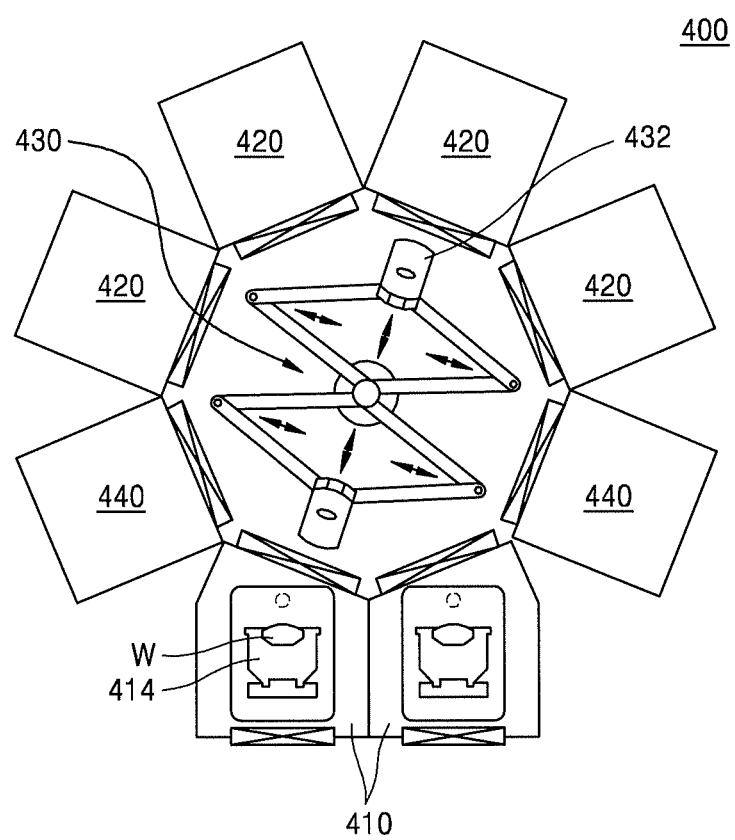
FIG. 12A is a schematic plan view illustrating major elements of an example of an integrated circuit device manufacturing apparatus 400 that may be used to perform a method of manufacturing an integrated circuit device, according to embodiments of the inventive concept.

FIG. 12A is a schematic plan view illustrating major elements of an example of an integrated circuit device manufacturing apparatus 400 that may be used to perform a method of manufacturing an integrated circuit device according to embodiments of the inventive concept.

Referring to FIG. 12A, the integrated circuit device manufacturing apparatus 400 includes a plurality of load lock chambers 410 capable of accommodating a cassette 414 on which a plurality of substrates W are mounted, a plurality of process chambers 420 in which a predetermined semiconductor device manufacturing process may be performed on the semiconductor substrates W, and a transfer chamber 430.

The transfer chamber 430 includes a robot arm 432 for transporting the substrates W and may communicate with the plurality of process chambers 420 and the load lock chambers 410. The integrated circuit device manufacturing apparatus 400 may further include an alignment chamber 440 used to align the substrates W, on which a predetermined semiconductor device manufacturing process is to be performed in the process chamber 420, in one direction.

The integrated circuit device manufacturing apparatus 400 includes a cluster tool including the transfer chamber 430 at a center and the load lock chamber 410, the plurality of process chambers 420, and the alignment chamber 440 connected around the transfer chamber 430.

The plurality of process chambers 420 may constitute a degassing chamber in which a degassing process for removing foreign substances such as moisture or impurities from the substrate W may be performed.

Figure 12B:
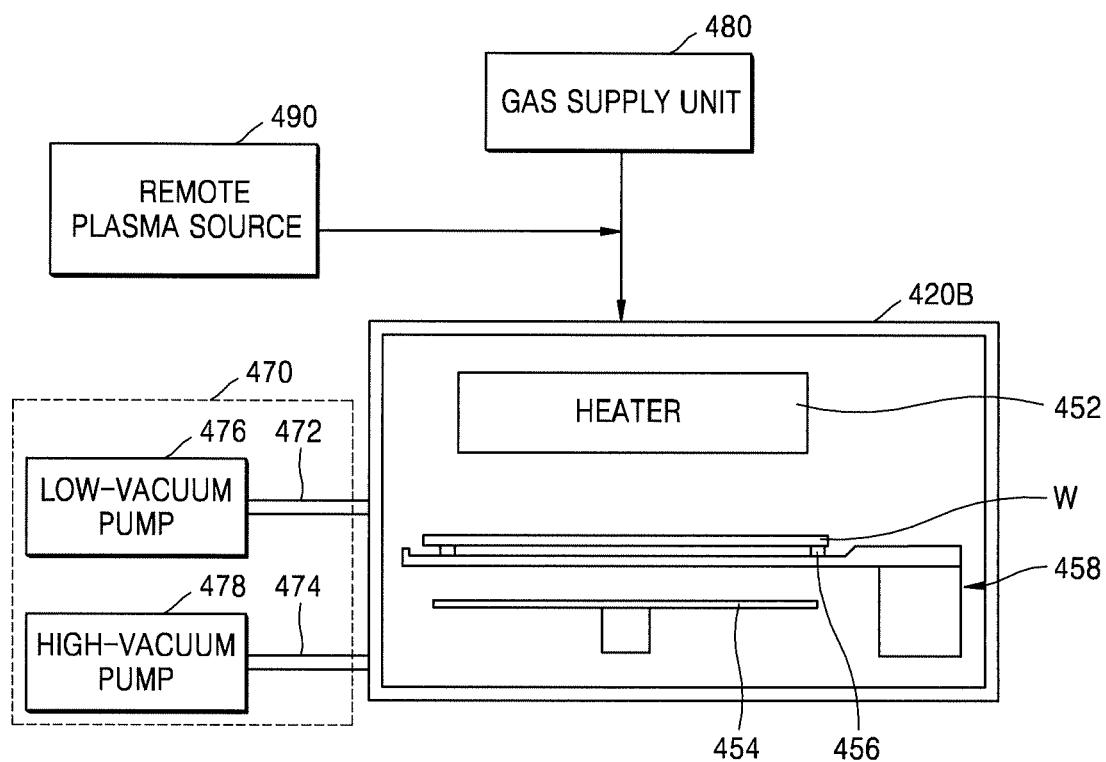
FIG. 12B is a view for explaining major elements of a process chamber that may form at least one of a plurality of process chambers constituting the integrated circuit device manufacturing apparatus illustrated in FIG. 12A.

FIG. 12B is a view for explaining major elements of a process chamber 420B which may constitute at least one of the plurality of process chambers 420 constituting the integrated circuit device manufacturing apparatus 400 illustrated in FIG. 12A.

Referring to FIG. 12B, the process chamber 420B may be used to perform an atomic layer deposition process, a heat treatment process, and/or a plasma treatment process. The process chamber 420B may be provided with a separate space that is sealed from the outside in order to remove foreign substances such as moisture and impurities remaining on the substrates W.

The process chamber 420B may include a heater 452 for heating the substrate W to a relatively high temperature, for example, about 300° C. to about 500° C., and a rotary chuck 454 rotating the substrate W at a position corresponding to the heater 452 in a lower portion of the process chamber 420B, and a wafer holder 458 used to raise the substrate W from the rotary chuck 454. The wafer holder 458 may include a plurality of pins 456 supporting the substrate W.

The wafer holder 458 may be used to lower the substrate W loaded on the wafer holder 458 so as to place the substrate W on the rotary chuck 454. The substrate W placed on the rotary chuck 454 may be heated by using the heater 452.

A vacuum exhaust apparatus 470 may be connected to the process chamber 420B. The vacuum exhaust apparatus 470 may reduce a pressure of the inside of the process chamber 420B to maintain a vacuum state. The vacuum exhaust apparatus 470 may include exhaust lines 472 and 474 that may communicate with the process chamber 420B so that a gas inside the process chamber 420B is discharged to the outside, and a low-vacuum pump 476 and a high-vacuum pump 478 respectively installed at the exhaust lines 472 and 474.

A gas supply unit 480 and a remote plasma source 490 connected to a gas supply path from the gas supply unit 480 to the process chamber 420B may be connected to the process chamber 420B. The remote plasma source 490 may be disposed at a suitable location for supplying a reactive remote plasma source onto the substrate W in the process chamber 420B. A nitrogen-containing gas and/or a hydrogen-containing gas that is needed to form process gases from the gas supply unit 480 to the remote plasma source 490 may be supplied, and these process gases may be dissociated in the remote plasma source 490 and transferred to the substrate W.

While the inventive concept has been particularly shown and described with reference to embodiments thereof, one of ordinary skill in the art will understand that various changes in form and details may be made therein without departing from the spirit and scope of the following claims. Therefore, any prospective modifications of the embodiments of the inventive concept will not be considered beyond the inventive concept.

What is claimed is:

1. An integrated circuit device comprising:
    a semiconductor substrate;
    a device isolation layer defining an active region of the semiconductor substrate;
    a gate insulating layer on the active region;
    a gate stack on the gate insulating layer, wherein the gate stack comprises a metal carbide layer and a metal layer on the metal carbide layer, and wherein the metal carbide layer comprises at least one layer having a carbon content of about 0.01 at % to about 15 at %;
    a spacer on a sidewall of the gate stack; and
    an impurity region provided on-both sides of the gate stack,
    wherein the metal carbide layer comprises a first metal carbide layer comprising carbon at a first concentration and a second metal carbide layer comprising carbon at a second concentration, and
    wherein the first concentration is lower than the second concentration.

2. The integrated circuit device of claim 1, wherein the first concentration is from about 0.01 at % to about 15 at %, and the second concentration is from about 15 at % to about 30 at %.

3. The integrated circuit device of claim 1, wherein the first metal carbide layer is closer to the gate insulating layer than the second metal carbide layer is.

4. The integrated circuit device of claim 1, wherein the gate stack further comprises a conductive barrier layer between the metal carbide layer and the metal layer.

5. The integrated circuit device of claim 1, wherein a carbon concentration of a portion of the first metal carbide layer gradually varies with respect to a distance from the gate insulating layer.

6. The integrated circuit device of claim 1, wherein a total carbon content of the metal carbide layer is from about 0.01 at % to about 15 at %.

7. The integrated circuit device of claim 1, wherein the metal carbide layer comprises at least one metal selected from the group consisting of titanium (Ti), tantalum (Ta), ruthenium (Ru), niobium (Nb), molybdenum (Mo), aluminum (Al), hafnium (Hf), lanthanum (La), vanadium (Va), and tungsten (W).

8. The integrated circuit device of claim 7, wherein the metal carbide layer comprises TiAlC.

9. The integrated circuit device of claim 1, wherein the active region is a fin-type active region.

10. The integrated circuit device of claim 1, further comprising a contact penetrating an interlayer insulating layer and electrically connecting the impurity region to another integrated circuit or semiconductor device.

11. An integrated circuit device comprising:
    a semiconductor substrate;
    a device isolation layer defining an active region of the semiconductor substrate;
    a gate insulating layer on the active region;
    a gate stack on the gate insulating layer, wherein the gate stack comprises a metal carbide layer and a metal layer on the metal carbide layer, wherein the metal carbide layer comprises a first metal carbide layer and a second metal carbide layer having different carbon contents from each other, and wherein the first metal carbide layer and the second metal carbide layer comprise the same type of metal;

a spacer on a sidewall of the gate stack; and an impurity region provided on both sides of the gate stack.

12. An integrated circuit device comprising:

a semiconductor substrate;

a device isolation layer defining an active region of the semiconductor substrate;

a gate insulating layer on the active region;

a gate stack on the gate insulating layer, wherein the gate stack comprises a metal carbide layer and a metal layer on the metal carbide layer, and wherein the metal carbide layer comprises at least one layer having a carbon content of about 0.01 at % to about 15 at %;

a spacer on a sidewall of the gate stack; and an impurity region provided on-both sides of the gate stack, wherein the at least one layer of the metal carbide layer has a carbon concentration that gradually varies with respect to a distance from the gate insulating layer.

* * * * *